(12) United States Patent
Okawa et al.

(10) Patent No.: US 6,831,334 B2
(45) Date of Patent: Dec. 14, 2004

(54) SEMICONDUCTOR DEVICE HAVING ELECTROSTATIC PROTECTION CIRCUIT AND METHOD OF FABRICATING THE SAME

(75) Inventors: Kazuhiko Okawa, Suwa (JP); Takayuki Saiki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/866,800

(22) Filed: May 30, 2001

(65) Prior Publication Data

US 2002/0030231 A1 Mar. 14, 2002

(30) Foreign Application Priority Data

May 31, 2000 (JP) ...................................... 2000-163021

(51) Int. Cl.[7] .......................... H01L 23/62; H01L 29/94
(52) U.S. Cl. ........................ 257/356; 257/288; 257/355
(58) Field of Search ................................. 257/173, 288, 257/339, 355–356

(56) References Cited

U.S. PATENT DOCUMENTS

| | | | | | |
|---|---|---|---|---|---|
| 4,336,489 | A | * | 6/1982 | Frederiksen | 323/231 |
| 5,166,089 | A | * | 11/1992 | Chen et al. | 437/51 |
| 5,235,201 | A | * | 8/1993 | Honna | 257/357 |
| 5,623,387 | A | * | 4/1997 | Li et al. | 361/56 |
| 5,744,841 | A | * | 4/1998 | Gilbert et al. | 257/360 |
| 5,877,534 | A | * | 3/1999 | Williams et al. | 257/355 |
| 5,920,774 | A | * | 7/1999 | Wu | 438/224 |
| 6,268,639 | B1 | * | 7/2001 | Li et al. | 257/577 |

FOREIGN PATENT DOCUMENTS

| | | | | |
|---|---|---|---|---|
| JP | A 2-271673 | 11/1990 | | |
| JP | A 3-234062 | 10/1991 | | |
| JP | A 5-136086 | 6/1993 | | |
| JP | 406204475 A | * 7/1994 | ......... | H01L/29/784 |
| JP | 406224376 A | * 8/1994 | ........... | L01L/27/08 |
| JP | A 7-94595 | 4/1995 | | |
| JP | A 7-106570 | 4/1995 | | |
| JP | A 7-273197 | 10/1995 | | |
| JP | 9-36357 | 2/1997 | | |
| JP | 10-12746 | 1/1998 | | |
| JP | 10-256393 | 9/1998 | | |
| JP | 11-233641 | 8/1999 | | |
| JP | 2000-138295 | 5/2000 | | |

OTHER PUBLICATIONS

S. Wolf and R.N. Tauber, "Silicon Processing for the VLSI Era", vol. 1—Process Technology, pp. 397–399, Lattice Press, Sunset Beach, California (USA), 1986 edition (ISBN 0–961672–3–7).*
S. Wolf, "Silicon Processing for the VLSI Era", vol. 3—The Submicron MOSFET, pp. 523–527, Lattice Press, Sunset Beach, California (USA), 1995 edition (ISBN 0–961672–5–3).*
U.S. Appl. No. 09/866,782, Okawa et al., filed May 30, 2001.
U.S. Appl. No. 09/873,370, Okawa, filed Jun. 5, 2001.

* cited by examiner

*Primary Examiner*—Minhloan Tran
*Assistant Examiner*—Johannes Mondt
(74) *Attorney, Agent, or Firm*—Oliff & Berridge, PLC

(57) ABSTRACT

A semiconductor device including an electrostatic protection circuit capable of preventing current from being concentrated in a hot spot through a silicide layer. A plurality of salicide N-type MOS transistors isolated by a first diffusion region are formed on a semiconductor substrate of this semiconductor device. An NPN lateral bipolar transistor and a Zener diode are formed as an electrostatic protection circuit for these MOS transistors. The NPN lateral bipolar transistor includes a P-type well and a second diffusion region which is formed in a region isolated by two second isolation regions. The Zener diode is formed by the PN junction between the first diffusion region of the MOS transistor and a third diffusion region. The breakdown start voltage of the Zener diode is set to be lower than the breakdown start voltage of the MOS transistor. A fourth diffusion region which makes up a Schottky diode together with the silicide layer is further provided between the silicide layer and the third diffusion region.

8 Claims, 29 Drawing Sheets

SEMICONDUCTOR DEVICE HAVING ELECTROSTATIC PROTECTION CIRCUIT AND METHOD OF FABRICATING THE SAME

Japanese Patent Application No. 2000-163021, filed May 31, 2000, is hereby incorporated by reference in its entirety.

FIELD OF THE INVENTION

The present invention relates to a semiconductor device having an electrostatic protection circuit and a method of fabricating the same.

DESCRIPTION OF RELATED ART

A major cause of an electrostatic breakdown phenomenon is silicon dissolution due to heat generated at a PN junction at the time of discharge or occurrence of contact spiking in which a metal of a metal electrode is diffused into a silicon substrate. Conventional countermeasures for static electricity have been carried out taking this point into consideration.

Accompanied by miniaturization of devices, in a miniaturization process with a design rule of 0.35 $\mu$m or less, salicide transistors have been developed in order to effectively decrease the resistivity of source/drain diffusion layers by employing salicide technology in which a high-melting-point metal silicide layer is formed on the diffusion layers (Japanese Patent Applications Laid-open No. 7-273197, No. 7-106570, No. 7-94595, No. 5-136086, No. 3-234062, and the like).

The thickness of a gate oxide film, which is normally 135 Angstroms in a device with a supply voltage of 5 V, tends to be decreased as the supply voltage is decreased. In a 0.35 $\mu$m process, the thickness of the gate oxide film is 70 Angstroms in a device with a supply voltage of 3.3 V, for example. In a 0.25 $\mu$m process, the thickness of the gate oxide film is about 50 Angstroms in a device with a supply voltage of 2.5 V. This is a serious hindrance in designing electrostatic protection circuits.

When allowing an electrostatic charge injected from an input/output terminal to be discharged through a power supply terminal, in the case where a silicide layer is present on the junction of a discharge device (such as a MOS transistor) interposed between the input/output terminal and the power supply terminal, the discharge device breaks down at a very low applied voltage.

The cause of the breakdown estimated from delamination analysis results is the occurrence of local current concentration near a gate electrode, because a notch-shaped trace of current flowing near the gate electrode of the MOS transistor occurred.

As a reason why current concentration tends to occur locally, a decrease in the resistivity of the diffusion layers by using the salicide technology can be given. In the case of applying a reverse voltage to the N-type MOS transistor, a charge injected from a pad is injected into the diffusion layers from a contact on the drain, and causes avalanche breakdown (electron avalanche) to occur at the junction with a channel region. The charge flowing out into the substrate causes the potential difference necessary for allowing a diode forward current to be produced between a source potential (ground potential) and a substrate potential. This causes a bipolar transistor formed by drain-channel-source to be operated, whereby the current is discharged with the voltage being clamped.

The state of discharge is described below with reference to FIGS. 32 and 33. FIGS. 32 and 33 are plan views showing an N-type MOS transistor including a drain 10, contacts 12 formed on the drain 10, a gate 14, a source 16, and contacts 18 formed on the source 16.

In the case where a silicide layer is not formed on the diffusion layers, the current uniformly flows from the contacts 12 on the drain 10 toward the gate 14 without being concentrated in one spot due to high diffusion resistivity, as shown in FIG. 32.

On the contrary, in the case where a silicide layer is formed on the diffusion layers, when a hot spot 20 is formed as shown in FIG. 33, the current is concentrated from all the contacts 12 on the drain 10 in the hot spot 20. Therefore, current concentration tends to occur even if the applied voltage is low, thereby causing breakdown to occur.

Moreover, the silicide layer cannot be formed flat near the junction, so that the silicide in the shape of a projection is present at a junction edge. Current concentration tends to occur in this area therefore the hot spot tends to occur.

An electrostatic discharge (ESD) withstanding voltage is considered to be decreased for these two reasons in the case where the silicide layer is present on the junction of the discharge device.

Therefore, technology additionally including a protection step for partly removing the silicide layer on the discharge device has been developed (Japanese Patent Application Laid-open No. 2-271673 and the like).

However, the following two problems occur when employing the protection step.

One of the problems is that leakage may occur between the gate and the source/drain. In the protection step, an oxide film is formed over the entire surface of the substrate after forming the source/drain regions and is etched while allowing the area in which the silicide is not formed to remain. A side-wall insulating film which has already been formed on the side of the gate is also removed during the etching so that leakage easily occurs.

The other problem is that high-speed operation of the transistor cannot be expected. In a full salicide process in which the silicide layer is formed on both the gate electrode and the diffusion regions, it is impossible to employ a structure in which the silicide layer is formed on the gate electrode but is not formed near the drain junction. Therefore, preventing the silicide layer from being formed near the drain junction causes a region to be formed on the gate electrode in which the silicide layer is not formed. This results in a sheet resistance of the order of KQ so that the high-speed operation cannot be expected.

SUMMARY OF THE INVENTION

According to one aspect of the present invention, there is provided a semiconductor device comprising:

a semiconductor substrate;

a MOS transistor which is formed on the semiconductor substrate and includes a first diffusion region;

a first isolation region which isolates the MOS transistor from other MOS transistors on the semiconductor substrate;

a second isolation region formed between the MOS transistor and the first isolation region;

a silicide layer formed on a surface of the semiconductor substrate excluding the first and second isolation regions;

a second diffusion region which is formed in a region isolated by the second isolation region and makes up a lateral bipolar transistor together with a well in the semiconductor substrate; and a third diffusion region which is formed at a deeper position of the first diffusion region near the second isolation region and makes up a Zener diode by the PN junction together with the first diffusion region of the MOS transistor.

Another aspect of the present invention provides a method of fabricating a semiconductor device comprising the steps of:

forming a first isolation region which isolates a MOS transistor to be formed on a semiconductor substrate from other MOS transistors;

forming a second isolation region between the first isolation region and a region in which the MOS transistor is to be formed;

forming a P-type well and an N-type well in the semiconductor substrate;

forming a first diffusion region of the MOS transistor in a part of the P-type and N-type wells near the boundary of the P-type and N-type wells of the semiconductor substrate;

forming a second diffusion region which make up a lateral bipolar transistor together with one of the P-type well and the N-type well of the semiconductor substrate in a region isolated by the second isolation region;

forming a third diffusion region which makes up a Zener diode by the PN junction together with the first diffusion region of the MOS transistor, in a region near the second isolation region and a deeper part of the first diffusion region; and forming a silicide layer on a surface of the semiconductor substrate excluding the first and second isolation regions.

According to still another aspect of the present invention, there is provided a semiconductor device comprising:

a semiconductor substrate;

a MOS transistor which is formed on the semiconductor substrate and includes a first diffusion region;

a first isolation region which isolates the MOS transistor from other MOS transistors on the semiconductor substrate;

a second isolation region formed between the MOS transistor and the first isolation region;

a second diffusion region which is formed in a region isolated by the second isolation region and makes up a lateral bipolar transistor together with a well in the semiconductor substrate;

a third diffusion region which is formed between the second isolation region and the first diffusion region and near a surface of the semiconductor substrate and makes up a Zener diode by the PN junction together with the first diffusion region of the MOS transistor; and a silicide layer formed on a surface of the semiconductor substrate excluding the first and second isolation regions and a region connecting the first and third diffusion regions.

A further aspect of the present invention provides a method of fabricating a semiconductor device comprising the steps of:

forming a first isolation region which isolates a MOS transistor to be formed on a semiconductor substrate from other MOS transistors;

forming a second isolation region between the first isolation region and a region in which the MOS transistor is to be formed;

forming a P-type well and an N-type well in the semiconductor substrate;

forming a first diffusion region of the MOS transistor in a part of the P-type well and the N-type well near the boundary of the P-type and N-type wells of the semiconductor substrate;

forming a second diffusion region which make up a lateral bipolar transistor together with one of the P-type well and the N-type well of the semiconductor substrate in a region isolated by the second isolation region;

forming a third diffusion region which makes up a Zener diode by the PN junction together with the first diffusion region of the MOS transistor, between the second isolation region and the first diffusion region and near a surface of the semiconductor substrate and; and forming a silicide layer on a surface of the semiconductor substrate excluding the first

DETAILED DESCRIPTION OF THE EMBODIMENTS

Figure 1:
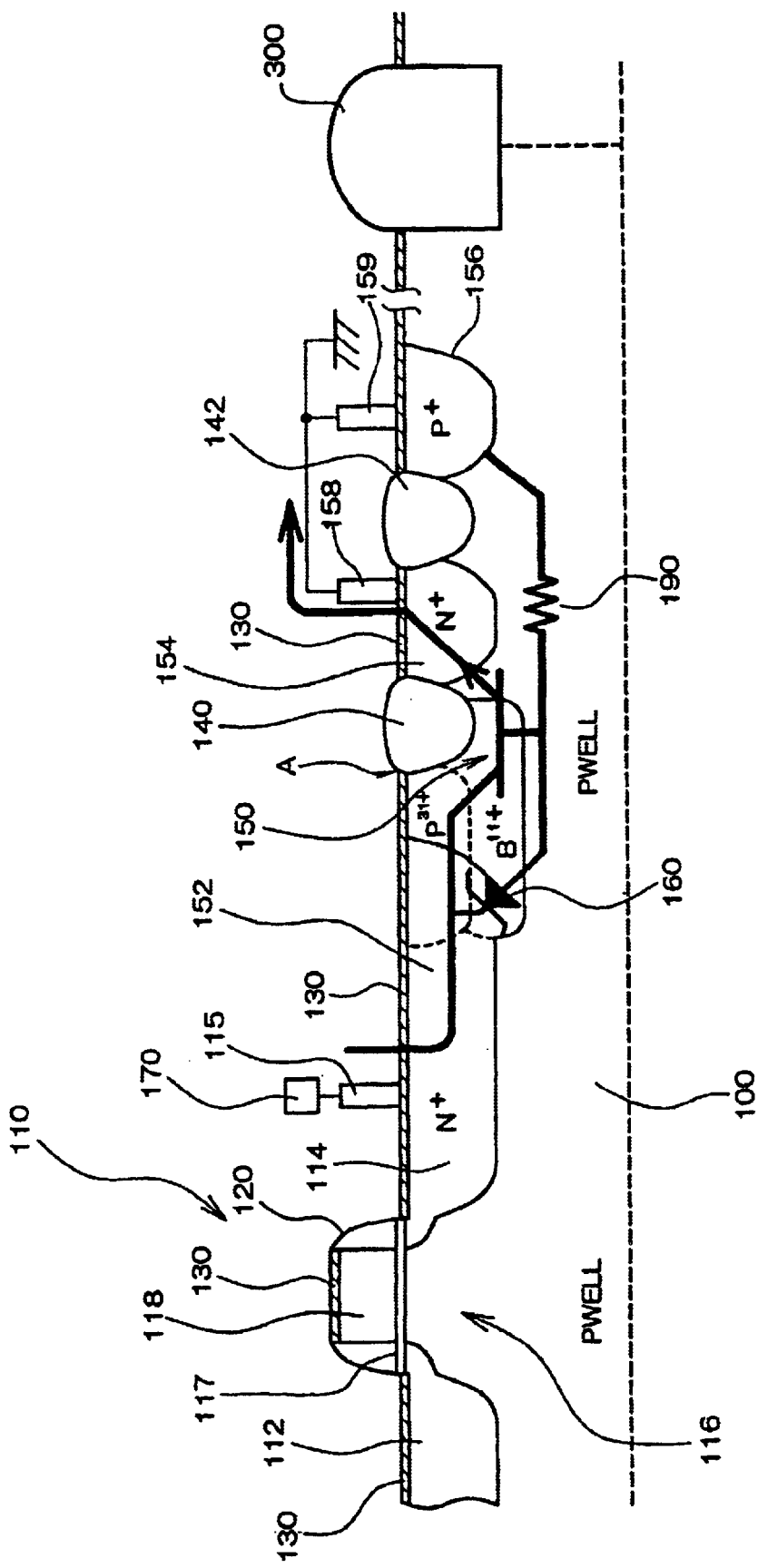
FIG. 1 is a cross-sectional view showing the structure of an N-type MOS transistor and an electrostatic protection circuit for a semiconductor device according to a first embodiment of the present invention.

According to one embodiment of the present invention, there is provided a semiconductor device comprising:

a semiconductor substrate;

a MOS transistor which is formed on the semiconductor substrate and includes a first diffusion region;

a first isolation region which isolates the MOS transistor from other MOS transistors on the semiconductor substrate;

a second isolation region formed between the MOS transistor and the first isolation region;

a silicide layer formed on a surface of the semiconductor substrate excluding the first and second isolation regions;

a second diffusion region which is formed in a region isolated by the second isolation region and makes up a lateral bipolar transistor together with a well in the semiconductor substrate; and a third diffusion region which is formed at a deeper position of the first diffusion region near the second isolation region and makes up a Zener diode by the PN junction with the first diffusion region of the MOS transistor.

According to this embodiment, the lateral bipolar transistor functions as a discharge device for an electrostatic protection circuit of the MOS transistor. Specifically, an electrostatic charge injected through the first diffusion region of the MOS transistor is discharged through the lateral bipolar transistor. A Zener diode is provided so as to prevent the MOS transistor from functioning as a discharge path. This Zener diode is inserted between a collector and a base of the lateral bipolar transistor in the equivalent circuit. The junction breakdown start voltage between the collector and the base is decreased by utilizing the reverse characteristics of the Zener diode, thereby controlling the discharge path.

In this case, it is unnecessary to take countermeasures for the MOS transistor such as formation of a high resistance in the first diffusion region, whereby high-speed operation of the MOS transistor can be achieved.

Moreover, since the Zener diode is formed at a comparatively deeper position from the surface of the semiconductor substrate, the charge injected into the first diffusion region scarcely flows through the surface of the low-resistivity silicide layer formed on the surface of the first diffusion region.

For this reason, it is unnecessary to perform a protection step for partly removing the silicide layer between the charge injection point of the first diffusion region and the second isolation region.

In the semiconductor device of this embodiment, the impurity concentration of the third diffusion region may be set to a value enabling a breakdown start voltage of the Zener diode to be lower than a breakdown start voltage of the MOS transistor.

This makes it possible to flow a current by using the Zener diode and turn on the lateral bipolar transistor to secure a discharge path, before the occurrence of the breakdown in the MOS transistor. Moreover, even if a comparatively high voltage is applied due to static electricity, the junction breakdown start voltage between the collector and the base of the lateral bipolar transistor can be decreased by allowing breakdown to occur at the Zener diode.

In the semiconductor device of this embodiment, an NPN lateral bipolar transistor may be formed by the first and second diffusion regions which are N-type diffusion regions and a P-type well which is formed in the semiconductor substrate; the MOS transistor having the first diffusion region may be an N-type MOS transistor which sets a potential of a pad to a low potential; and the third diffusion region which makes up the Zener diode by the junction with the first diffusion region may be a P-type diffusion region.

This enables the N-type MOS transistor to be protected by operating the NPN lateral bipolar transistor as described above using the Zener diode as a trigger.

Alternatively, a PNP lateral bipolar transistor may be formed by the first and second diffusion regions which are P-type diffusion regions and an N-type well which is formed in the semiconductor substrate; the MOS transistor having the first diffusion region may be a P-type MOS transistor which sets a potential of a pad to a high potential; and the third diffusion region which makes up the Zener diode by the junction with the first diffusion region may be an N-type diffusion region.

This enables the P-type MOS transistor to be protected by operating the PNP lateral bipolar transistor as described above using the Zener diode as a trigger.

The semiconductor device of this embodiment may further comprise a fourth diffusion region which is provided between the silicide layer and the third diffusion region and makes up a Schottky diode together with the silicide layer.

The amount of charge passing through the surface of the silicide layer is reduced and thus the occurrence of current concentration caused by current flowing through the silicide layer can be prevented by forming a Schottky diode in this manner.

If the third diffusion region is an N-type diffusion region, the semiconductor device of this embodiment may further comprise fourth and fifth diffusion regions formed between the silicide layer and the third diffusion region so that the third, fourth, and fifth diffusion regions can make up a PNP bipolar transistor.

The occurrence of current concentration caused by current flowing through the silicide layer can be prevented more reliably by forming the PNP bipolar transistor in this manner.

If the third diffusion region is a P-type diffusion region, the semiconductor device of this embodiment may further comprise fourth and fifth diffusion regions formed between the silicide layer and the third diffusion region so that the third, fourth, and fifth diffusion regions can make up an NPN bipolar transistor.

The occurrence of current concentration caused by current flowing through the silicide layer can be prevented more reliably by forming the NPN bipolar transistor in this manner.

In the semiconductor device of according to this embodiment, if the semiconductor substrate has a triple well structure, a protection circuit including the lateral bipolar transistor and the Zener diode may be independently formed for each of an N-type MOS transistor and a P-type MOS transistor formed on this semiconductor substrate.

If the above protection circuit is provided for only the N-type MOS transistor, a diffusion resistance may be disposed between the drain of the P-type MOS transistor and the pad, thereby preventing the P-type MOS transistor from becoming a discharge path. In this case, it is preferable to form this diffusion resistance in the step of forming the third diffusion region. This is because an increase in the fabrication cost accompanied by countermeasures for electrostatic discharge protection can be reduced.

In the same manner, if the above protection circuit is provided for only the P-type MOS transistor, a diffusion resistance may be disposed between the drain of the N-type MOS transistor and the pad, thereby preventing the N-type MOS transistor from becoming a discharge path. In this case, it is preferable to form this diffusion resistance in the step of forming the third diffusion region. This is because an increase in the fabrication cost accompanied by countermeasures for electrostatic discharge protection can be reduced.

According to another embodiment of the present invention, there is provided a method of fabricating a semiconductor device comprising the steps of:

forming a first isolation region which isolates a MOS transistor to be formed on a semiconductor substrate from other MOS transistors;

forming a second isolation region between the first isolation region and a region in which the MOS transistor is to be formed;

forming a P-type well and an N-type well in the semiconductor substrate;

forming a first diffusion region of the MOS transistor in a part of the P-type and N-type wells near the boundary of the P-type and N-type wells of the semiconductor substrate;

forming a second diffusion region which make up a lateral bipolar transistor together with one of the P-type well and the N-type well of the semiconductor substrate in a region isolated by the second isolation region;

forming a third diffusion region which makes up a Zener diode by the PN junction together with the first diffusion region of the MOS transistor, in a region near the second isolation region and a deeper part of the first diffusion region; and forming a silicide layer on a surface of the semiconductor substrate excluding the first and second isolation regions.

This method of fabricating a semiconductor device can suitably fabricate a semiconductor device according to this embodiment. The first and second isolation regions may be formed in the same time. The first and second diffusion regions may also be formed in the same time.

In this fabrication method, the impurity concentration of the third diffusion region may be set in the same manner as in the above described embodiment.

The method of fabricating a semiconductor device according to this embodiment may further comprise a step of forming a fourth diffusion region which is provided between the silicide layer and the third diffusion region and makes up a Schottky diode together with the silicide layer. In this case, the third and fourth diffusion regions may be formed by forming a mask on the semiconductor substrate and using the mask to dope the semiconductor substrate with impurities.

Countermeasures for electrostatic discharge protection improves the additional value of the semiconductor device. The fabrication cost accompanied by the countermeasures for electrostatic discharge protection can be reduced by sharing a mask.

The method of fabricating a semiconductor device according to this embodiment may further comprise a step of forming fourth and fifth diffusion regions between the silicide layer and the third diffusion region, so that the third, fourth, and fifth diffusion regions can make up a bipolar transistor. In this case, the third, fourth and fifth diffusion regions may be formed by forming a mask on the semiconductor substrate and using the mask to dope the semiconductor substrate with impurities. This is because the fabrication cost accompanied by countermeasures for electrostatic discharge protection can be reduced.

According to still another embodiment of the present invention, there is provided a semiconductor device comprising:

a semiconductor substrate;

a MOS transistor which is formed on the semiconductor substrate and includes a first diffusion region;

a first isolation region which isolates the MOS transistor from other MOS transistors on the semiconductor substrate;

a second isolation region formed between the MOS transistor and the first isolation region;

a second diffusion region which is formed in a region isolated by the second isolation region and makes up a lateral bipolar transistor together with a well in the semiconductor substrate;

a third diffusion region which is formed between the second isolation region and the first diffusion region and near a surface of the semiconductor substrate and makes up a Zener diode by the PN junction together with the first diffusion region of the MOS transistor; and a silicide layer formed on a surface of the semiconductor substrate excluding the first and second isolation regions and a region connecting the first and third diffusion regions.

The difference between this semiconductor device and the semiconductor device according to the above described embodiment is that the silicide layer formed on the surface of the region connecting the first and third diffusion regions is removed, because the third diffusion region is formed near the surface of the semiconductor substrate in this embodiment. This allows the lateral bipolar transistor to be used as a discharge device and prevents the occurrence of current concentration at the junction edge.

A further embodiment of the present invention provides a method of fabricating a semiconductor device comprising the steps of:

forming a first isolation region which isolates a MOS transistor to be formed on a semiconductor substrate from other MOS transistors;

forming a second isolation region between the first isolation region and a region in which the MOS transistor is to be formed;

forming a P-type well and an N-type well in the semiconductor substrate;

forming a first diffusion region of the MOS transistor in a part of the P-type well and the N-type well near the boundary of the P-type and N-type wells of the semiconductor substrate;

forming a second diffusion region which make up a lateral bipolar transistor together with one of the P-type well and the N-type well of the semiconductor substrate in a region isolated by the second isolation region;

forming a third diffusion region which makes up a Zener diode by the PN junction together with the first diffusion region of the MOS transistor, between the second isolation region and the first diffusion region and near a surface of the semiconductor substrate and; and forming a silicide layer on a surface of the semiconductor substrate excluding the first and second isolation regions and a region connecting the first and third diffusion regions.

This method of fabricating a semiconductor device can suitably fabricate a semiconductor device according to this embodiment.

Specific examples of the semiconductor device according to the embodiments of the present invention are described below with reference to the drawings.

First Embodiment (1) Structure of N-type MOS Transistor and Electrostatic Protection Circuit FIG. 1 shows a cross-sectional structure of an N-type MOS transistor and an electrostatic protection circuit for the N-type MOS transistor. In FIG. 1, an N-type MOS transistor 110 is formed on a silicon substrate 100. The N-type MOS transistor 110 includes an N$^+$ source 112, an N$^+$ drain 114 (first diffusion region), a channel 116 of a P-type well present therebetween, and a gate 118 which faces the channel 116 through a gate oxide film 117. A side-wall insulating film 120 is formed on the side wall of the gate 118. A silicide layer 130 is formed on the source 112, drain 114, and gate 118, whereby the N-type MOS transistor 110 is formed as a salicide transistor. FIG. 1 illustrates a condition in which a contact 115 connected to the drain 114 is connected to a pad 170.

In FIG. 1, in addition to a first isolation region 300 for isolating each of the transistors, two second isolation regions 140 and 142 formed by a LOCOS process in the same manner as the first isolation region are formed. An N$^+$ region 154 is formed between the second isolation regions 140 and 142. A P$^{30}$ region 156 connected to the P-type well of the semiconductor substrate is formed in the region isolated from the N$^+$ region 154 by the second isolation region 142. These regions are referred to as second diffusion regions.

A phosphorus diffusion region P$^{31+}$ (fourth diffusion region) doped with phosphorus (P) having a mass number of 31 and a boron diffusion region B$^{11+}$ (third diffusion region) doped with boron (B) having a mass number of 11 are formed in that order between the drain 114 and the second isolation region 140 in the direction of the thickness of the silicon substrate 100, for example. A PN junction is formed between the B$^{11+}$ diffusion region and the drain 114 at a deeper position of the drain 114.

An NPN lateral bipolar transistor 150 is formed by a collector 152 formed in the same N$^+$ diffusion region as the drain 114, an emitter formed by the N$^+$ region 154 (hereinafter may be called emitter 154 ), and a base region combining the B$^{11+}$ doped region 150 in the P-type well and its surroundings in the P-type well. A base contact is formed by the P$^+$ region 156 connected to the P-type well (hereinafter may be called base contact 156 ). FIG. 1 shows a contact 158 connected to the emitter 154 and a contact 159 connected to the base contact 156, both of which are grounded.

A Zener diode 160 is formed by a PN junction between the drain 114 (collector 152) which is an N-type diffusion region and the B$^{11+}$ diffusion region which is a P-type diffusion region shown in FIG. 1.

Figure 2:
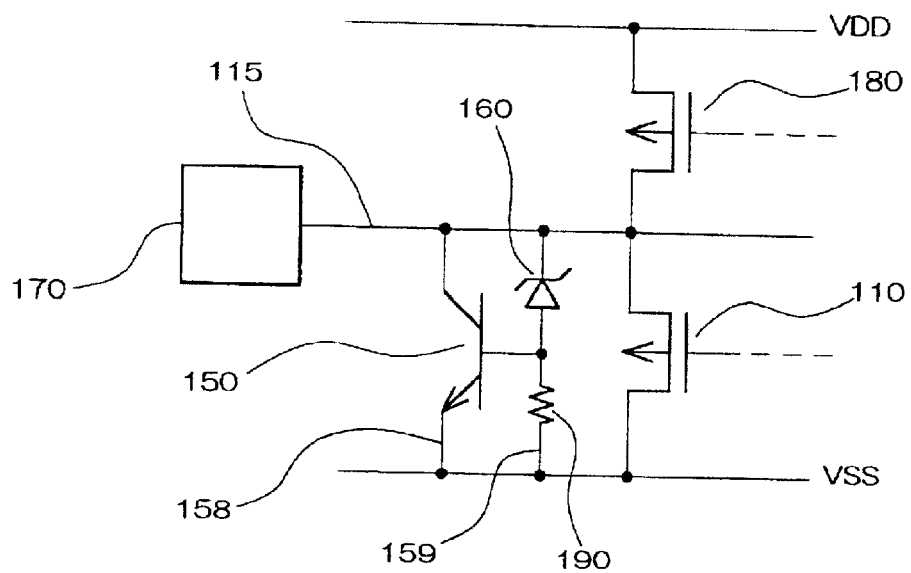
FIG. 2 is an equivalent circuit diagram of the semiconductor device shown in FIG. 1.

FIG. 2 shows an equivalent circuit formed by the semiconductor structure shown in FIG. 1. The N-type MOS transistor 110, the NPN lateral bipolar transistor 150, the Zener diode 160, the pad 170, a P-type MOS transistor 180 formed in pairs with the N-type MOS transistor 110, and a resistance 190 are shown in FIG. 2. The resistance 190 shown in FIG. 2 is formed by the P-type well under the emitter 154 shown in FIG. 1.

The N-type MOS transistor 110 sets the potential of the pad 170 to a LOW (VSS) potential. The P-type MOS transistor 180 sets the potential of the pad 170 to a HIGH (VDD) potential.

(2) Operation of Electrostatic Protection Circuit for N-type MOS Transistor

In the electrostatic protection circuit for the N-type MOS transistor 110 shown in FIGS. 1 and 2, the NPN lateral bipolar transistor 150 functions as a discharge device. Specifically, an electrostatic charge injected from the pad 170 is discharged through the drain 114, the collector 152 of the NPN lateral bipolar transistor 150, the emitter 154 of the NPN lateral bipolar transistor 150, the contact 158, and GND in that order.

In this case, since the N-type MOS transistor 110 and the NPN lateral bipolar transistor 150 are connected in parallel to the pad 170, as shown in FIG. 2, it is necessary to cut off the discharge path toward the N-type MOS transistor 110.

Therefore, the Zener diode 160 is inserted between the collector 152 and the base 156 of the NPN lateral bipolar transistor 150, as shown in FIGS. 1 and 2, thereby decreasing the junction breakdown start voltage between the collector 152 and the base 156. This enables the discharge path to be controlled.

Figure 3:
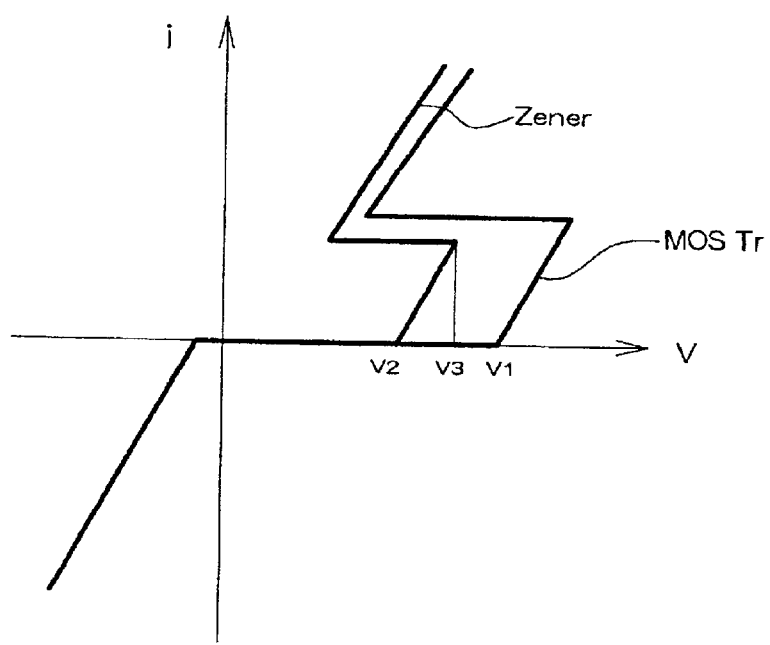
FIG. 3 is a characteristic diagram showing the voltage-current characteristics of the MOS transistor and the Zener diode shown in FIGS. 1 and 2.

FIG. 3 is a characteristic diagram showing the voltage-current characteristics of the MOS transistor 110 and the NPN lateral bipolar transistor 150 using the Zener diode 160 as a trigger.

The voltage-current characteristics of the N-type MOS transistor 110 shown in FIG. 3 show voltage-current characteristics when the current flows from the drain 114 to the source 112 in the reverse direction. When the current flows from the source 112 to the drain 114 in the forward direction, the current begins to flow at an applied voltage of 0.7 V or more. In the reverse direction, breakdown (avalanche) occurs at an applied voltage of V1 (about 10 V, for example), as shown in FIG. 3, whereby the current suddenly begins to flow. In order to prevent this phenomenon, the NPN lateral bipolar transistor 150 is caused to snapback in accordance with the bipolar action, thereby allowing the voltage to be clamped.

Specifically, the Zener diode 160 allows current to flow at a breakdown start voltage V2 (about 6V, for example) as the reverse characteristics. This causes the NPN lateral bipolar transistor 150 to be operated using the Zener diode 160 as a trigger. When the voltage exceeds a snapback start voltage V3, the voltage is clamped whereby the voltage becomes almost constant irrespective of the current value.

In the first embodiment, current is caused to flow by the Zener diode 160 at the voltage V2 before breakdown occurs in the MOS transistor 110 (before reaching voltage V1). This causes the NPN lateral bipolar transistor 150 to be turned ON, thereby securing the discharge path. The collector-emitter voltage of the NPN lateral bipolar transistor 150 is held at a voltage of about 5 V by the snapback, whereby the electrostatic charge is discharged. In the case where a comparatively high voltage is applied due to static electricity, the junction breakdown start voltage between the collector 152 and the base 156 of the NPN lateral bipolar transistor 150 is decreased by allowing breakdown to occur in the Zener diode 160.

Figure 4:
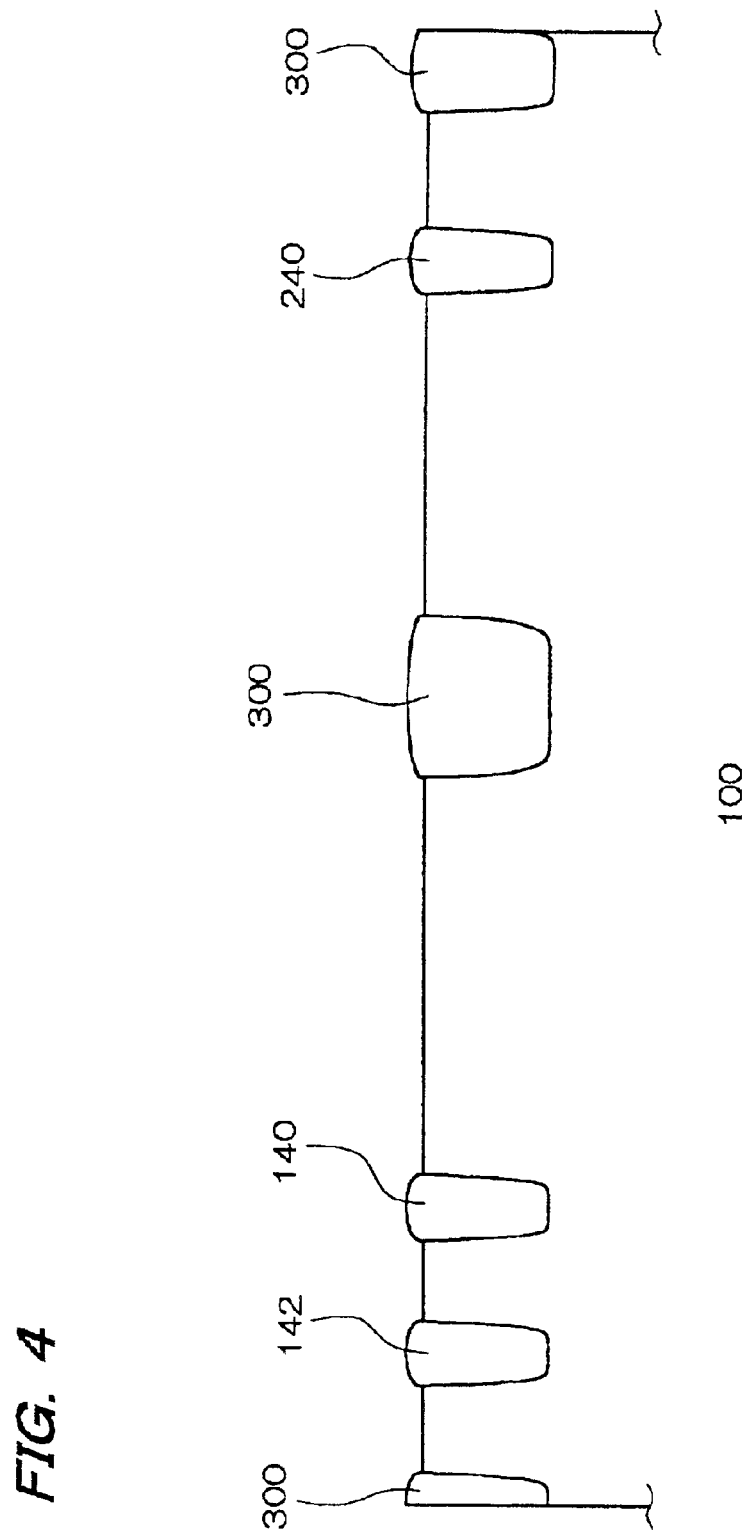
FIG. 4 is a cross-sectional view showing a first fabrication step of the semiconductor device shown in FIG. 1.

Therefore, if the breakdown start voltage V2 of the Zener diode 160 shown in FIG. 4 is lower than the breakdown start voltage V1 of the MOS transistor 110, it is possible to deal with a case where a comparatively high voltage is applied as described above.

Since the Zener diode 160 is formed by the PN junction between the drain 114 and the $B^{11}$ ion doped diffusion region present at a comparatively deeper position from the surface of the silicon substrate 100, a charge injected into the drain 114 scarcely flows through the surface of the low-resistivity silicide layer 130.

According to the structure shown in FIG. 1, a Schottky diode is formed by the silicide layer 130 and the $P^{31}$ diffusion region. Therefore, the amount of charge flowing through the surface of the silicide layer 130 is further decreased, thereby preventing the occurrence of current concentration at point A shown in FIG. 1.

For these two reasons, it is unnecessary to perform a protection step to partly remove the silicide layer 130 between the contact 115 and the second isolation region 140.

According to the present embodiment, in which the protection step is not needed, the $P^{31}$ diffusion region can be preferably formed by doping with N-type impurities at a concentration lower than that of the drain 114. The $B^{11}$ diffusion region is formed by doping with P-type impurities at a concentration higher than that of the P-type well of the silicon substrate 100. Still more preferably, the impurity concentration in the $B^{11}$ diffusion region is determined so as to provide the relation V2<V3<V1 shown in FIG. 4.

(3) Fabrication Process

The fabrication process of the semiconductor device shown in FIG. 1 is described below with reference to FIGS. 4 to 22. FIGS. 4 to 22 illustrate steps for fabricating the N-type MOS transistor 110, the electrostatic protection circuit therefor, and the P-type MOS transistor 180.

As shown in FIG. 4, a first isolation region 300 for isolating the transistor elements, two second isolation regions 140 and 142 for the N-type MOS transistor 110 shown in FIG. 1, and a second isolation region 240 for the P-type MOS transistor are formed in the silicon substrate 100 by a LOCOS process.

Figure 5:
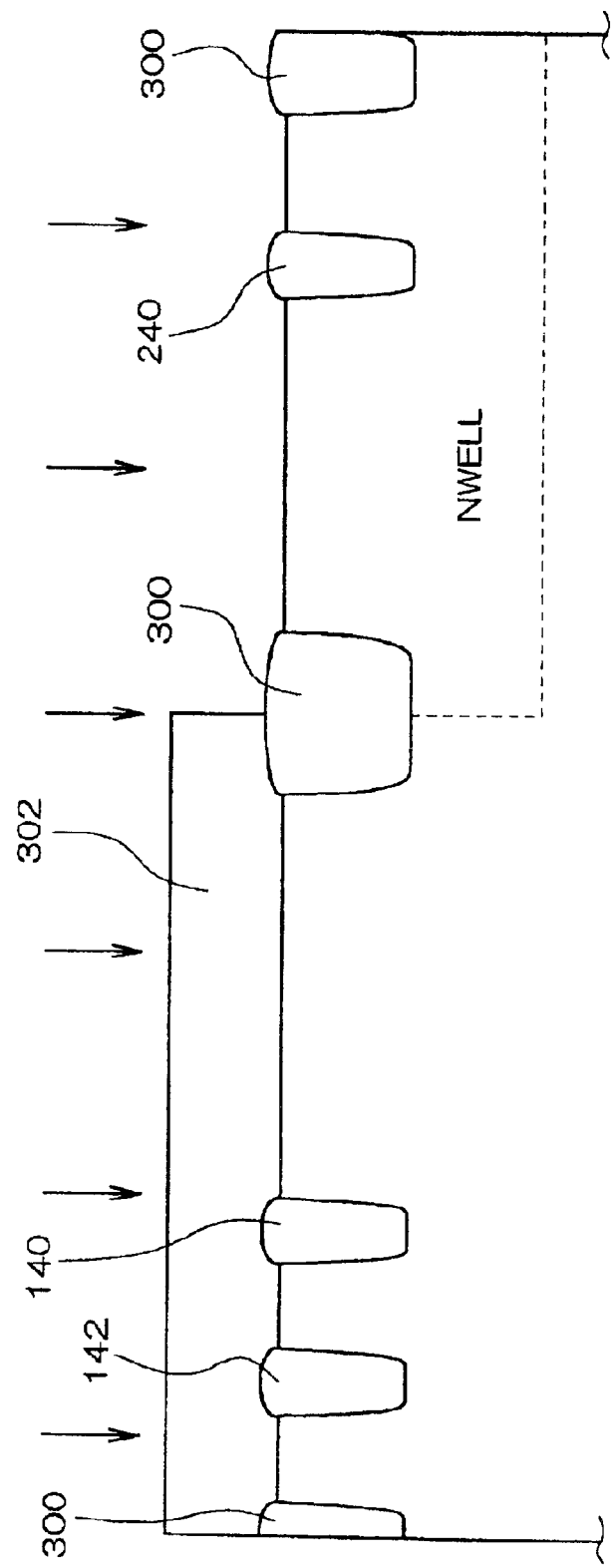
FIG. 5 is a cross-sectional view showing a second fabrication step of the semiconductor device shown in FIG. 1.

The silicon substrate 100 is doped by ion implantation while covering part of the silicon substrate 100 with a resist 302, thereby forming an N-type well in the unmasked region, as shown in FIG. 5.

Figure 6:
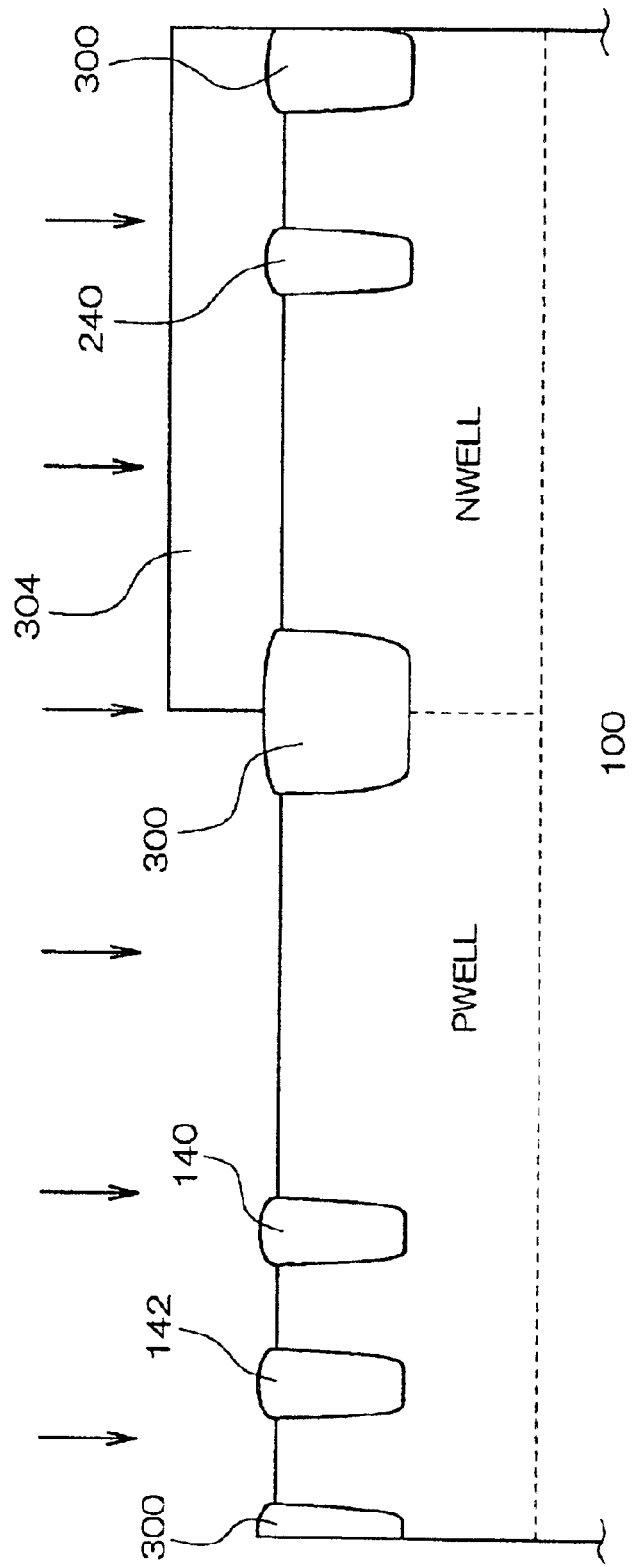
FIG. 6 is a cross-sectional view showing a third fabrication step of the semiconductor device shown in FIG. 1.

After removing the resist 302, the silicon substrate 100 is doped by ion implantation while covering part of the silicon substrate 100 with a resist 304, thereby forming a P-type well in the unmasked region, as shown in FIG. 6.

Figure 7:
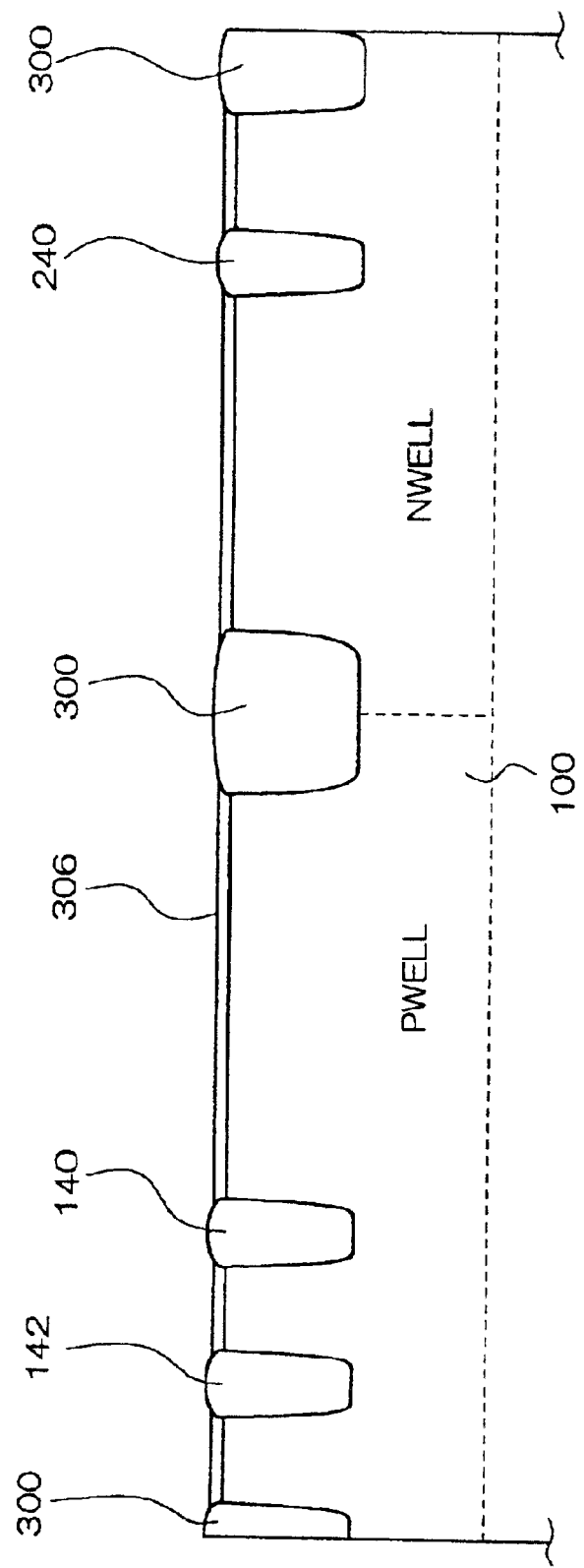
FIG. 7 is a cross-sectional view showing a fourth fabrication step of the semiconductor device shown in FIG. 1.
Figure 8:
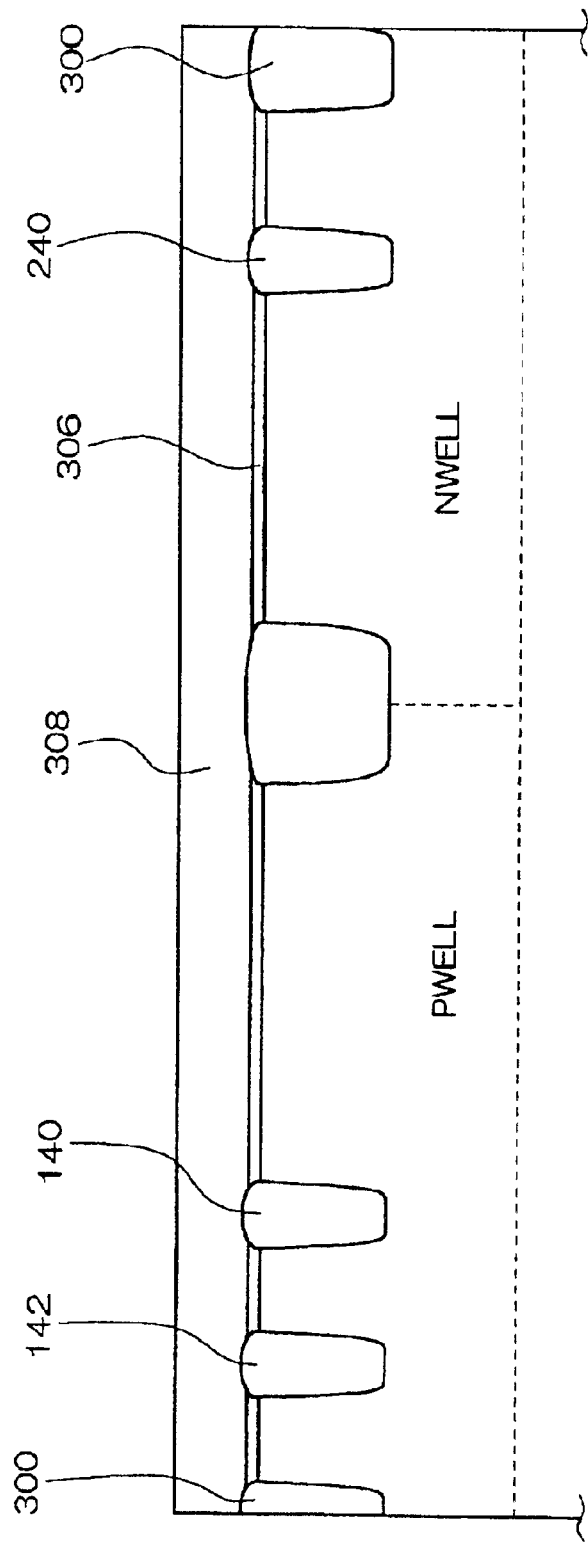
FIG. 8 is a cross-sectional view showing a fifth fabrication step of the semiconductor device shown in FIG. 1.
Figure 9:
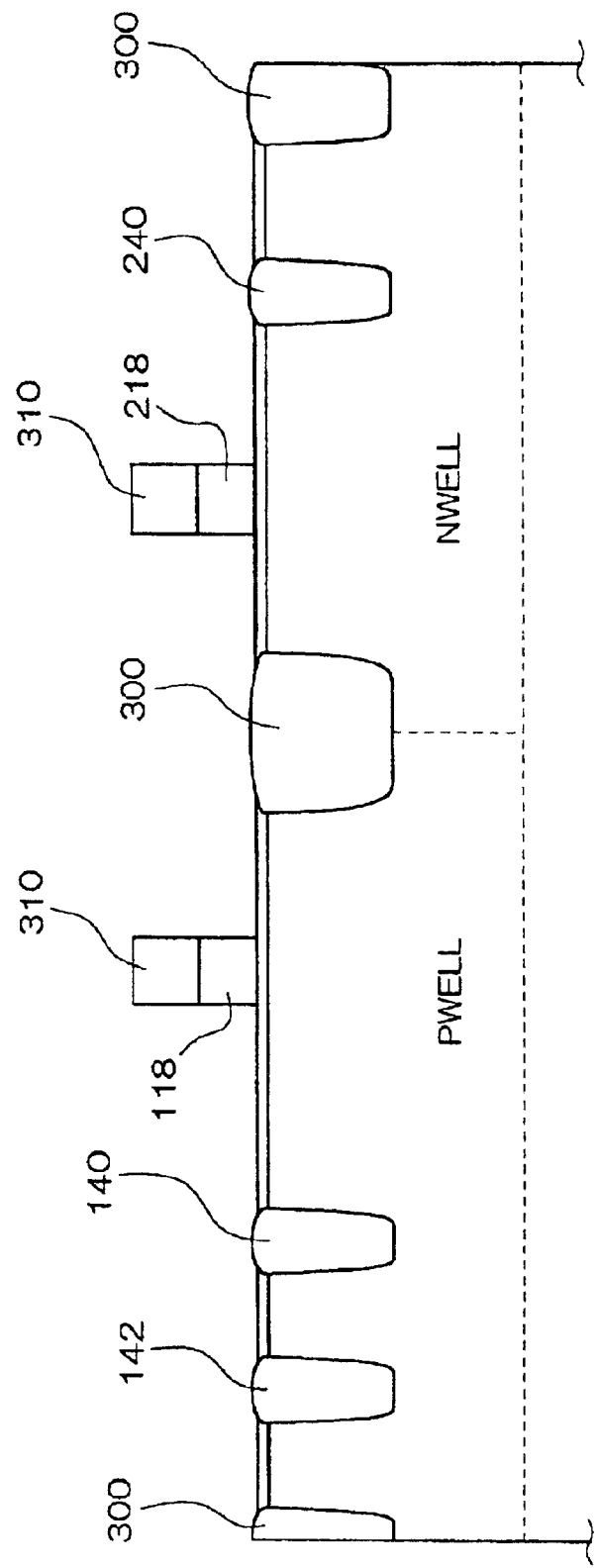
FIG. 9 is a cross-sectional view showing a sixth fabrication step of the semiconductor device shown in FIG. 1.

After removing the resist 304, an oxide film 306 is formed over the entire surface of the silicon substrate 100, as shown in FIG. 7. A polysilicon film 308 is then formed on the oxide film 306, as shown in FIG. 8. After patterning a resist 310 on the polysilicon film 308 by a photolithography process, the polysilicon film 308 is etched using the resist 310 as a mask, thereby forming the gates 118 and 218, as shown in FIG. 9.

Figure 10:
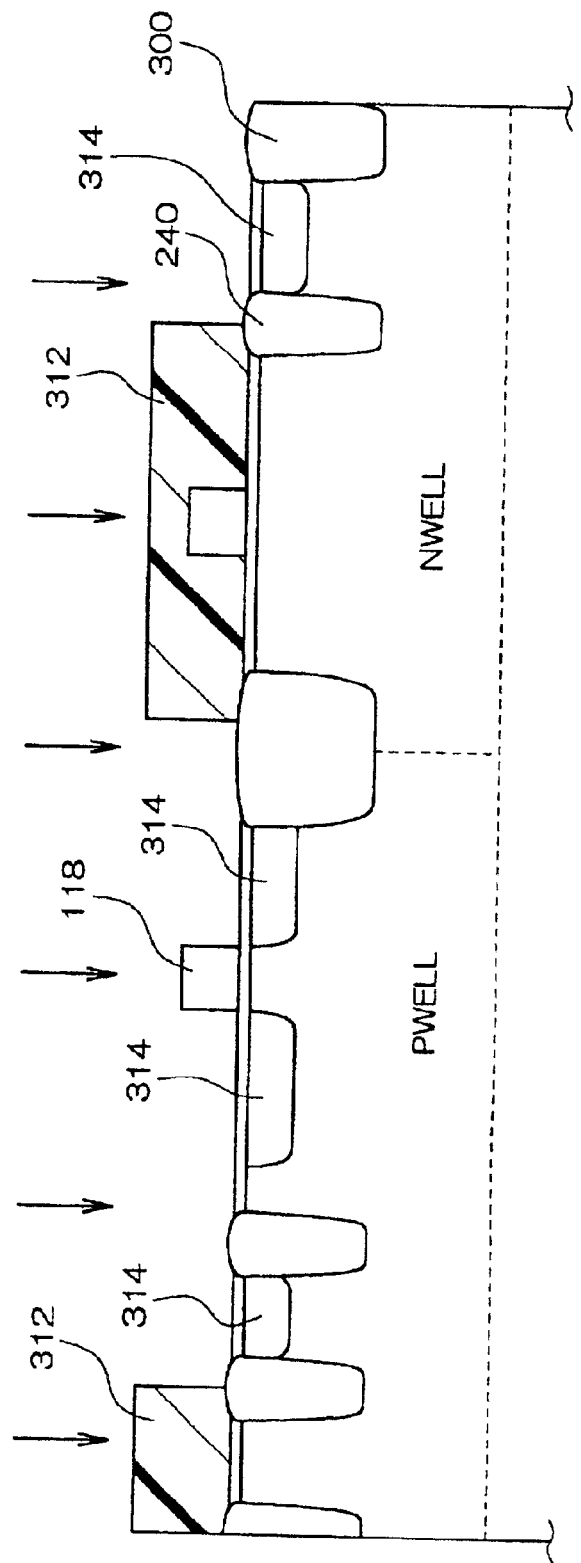
FIG. 10 is a cross-sectional view showing a seventh fabrication step of the semiconductor device shown in FIG. 1.

After patterning a resist 312 by a photolithography process, N-type impurities are implanted at a low concentration using the resist 312 and the gate 118 as masks, thereby forming N-type diffusion regions 314, as shown in FIG. 10.

Figure 11:
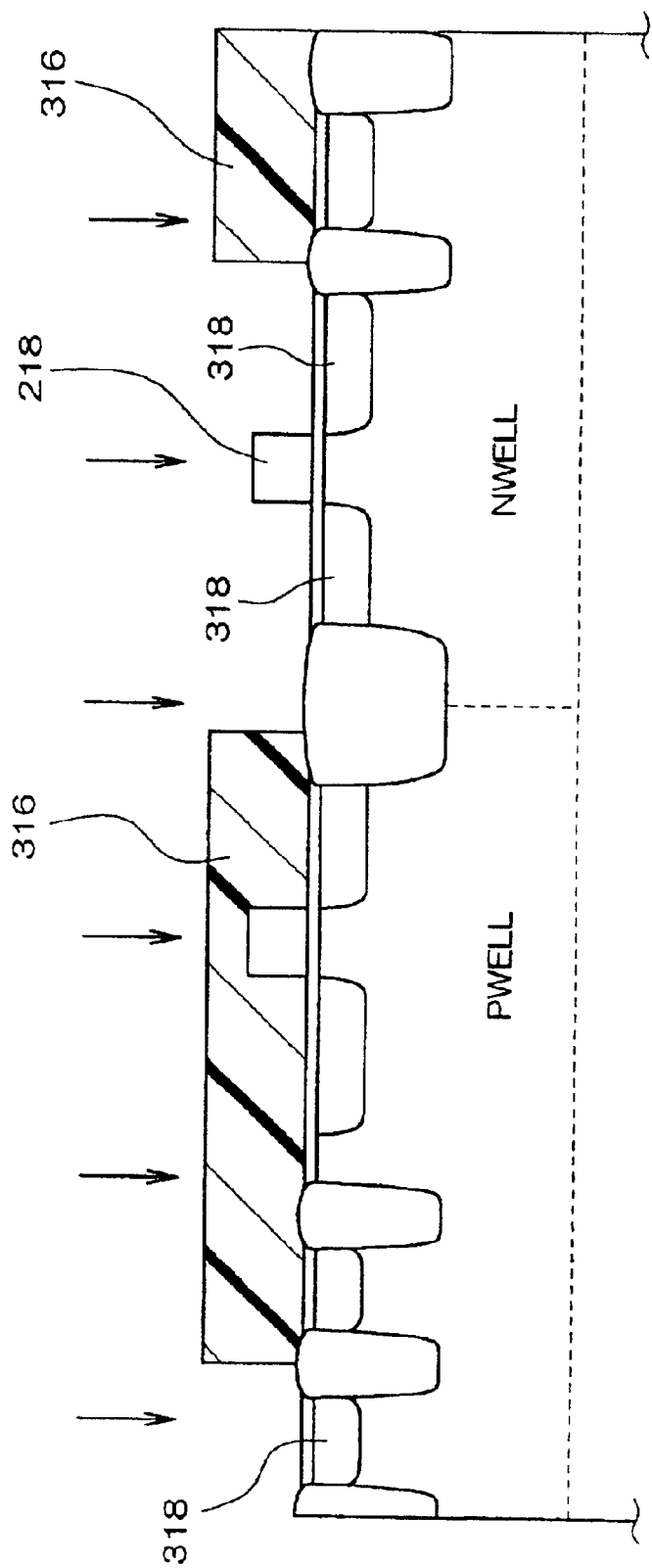
FIG. 11 is a cross-sectional view showing an eighth fabrication step of the semiconductor device shown in FIG. 1.

After removing the resist 312, a resist 316 is patterned by a photolithography process, as shown in FIG. 11. P-type impurities are implanted at a low concentration using the resist 316 and the gate 218 as masks, thereby forming P-type diffusion regions 318.

Figure 12:
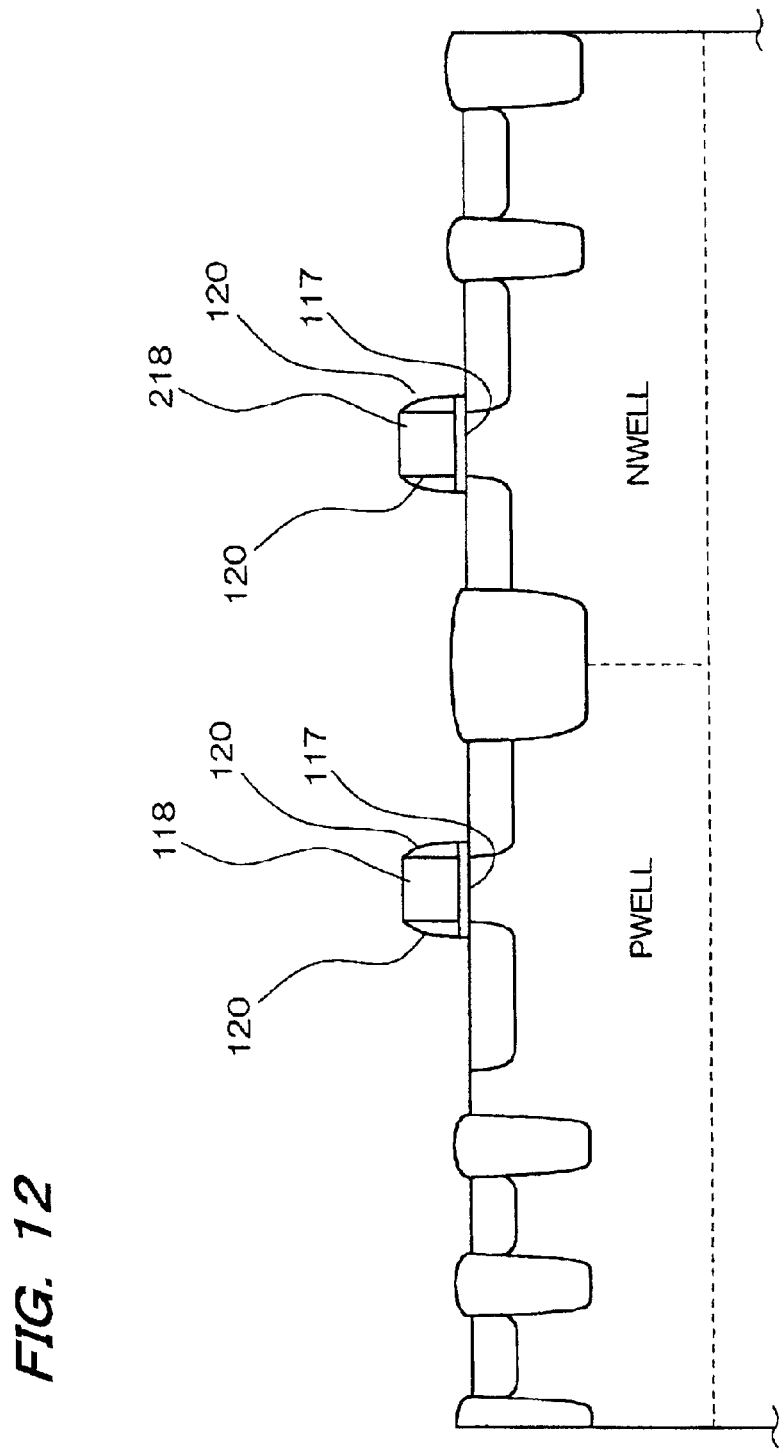
FIG. 12 is a cross-sectional view showing a ninth fabrication step of the semiconductor device shown in FIG. 1.

After removing the resist 316, the side-wall insulating film 120 is formed on the side wall of the gates 118 and 218, as shown in FIG. 12. The oxide film 306 is etched using the gates 118 and 218 and the side-wall insulating film 120 as masks, thereby allowing a gate oxide film 117 to remain under the gates 118 and 218 and the side-wall insulating film 120.

Figure 13:
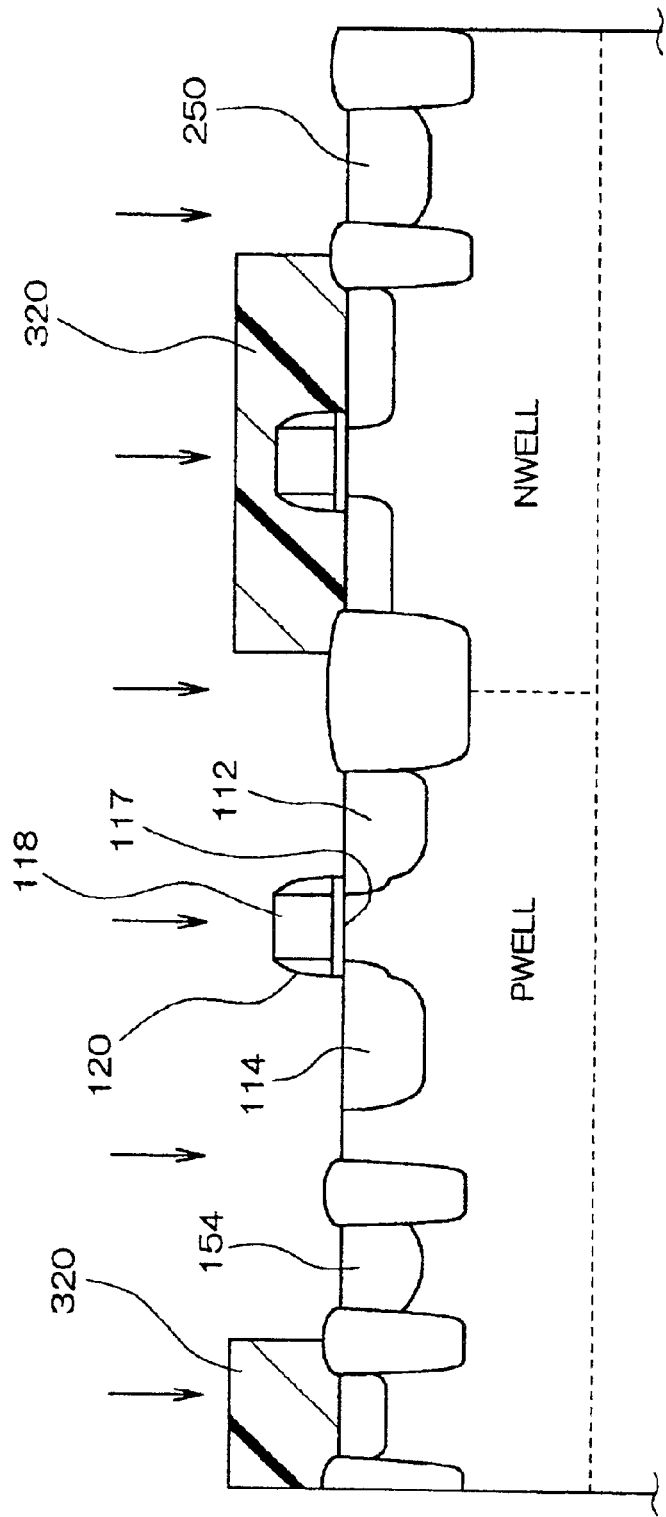
FIG. 13 is a cross-sectional view showing a tenth fabrication step of the semiconductor device shown in FIG. 1.

After patterning a resist 320 by a photolithography process, as shown in FIG. 13, a high concentration of N-type 28 impurities are implanted using the resist 320, the gate 118, and the side-wall insulating film 120 as masks. The source 112, the drain 114 (collector 152), and the emitter 154 shown in FIG. 1, and an N+ diffusion region 250 which functions as a P stopper diffusion layer of a P-type MOS transistor 200 are formed by this step, as shown in FIG. 13.

Figure 14:
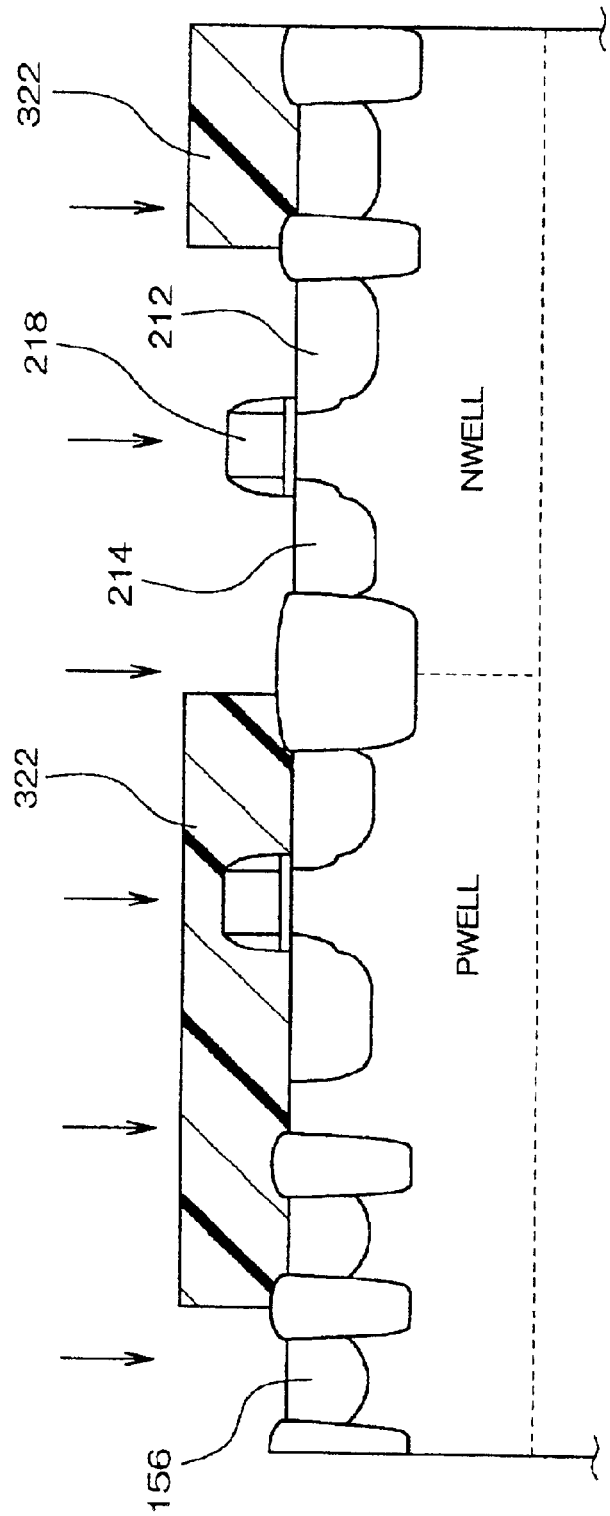
FIG. 14 is a cross-sectional view showing an eleventh fabrication step of the semiconductor device shown in FIG. 1.

After removing the resist 320, a resist 322 is patterned by a photolithography process, as shown in FIG. 14. A high concentration of impurities is implanted using the resist 322, the gate 218, and the side-wall insulating film 120 as masks. The base 156 shown in FIG. 1, and a source 212 and a drain 214 of the P-type MOS transistor 200 are formed by this step.

Figure 15:
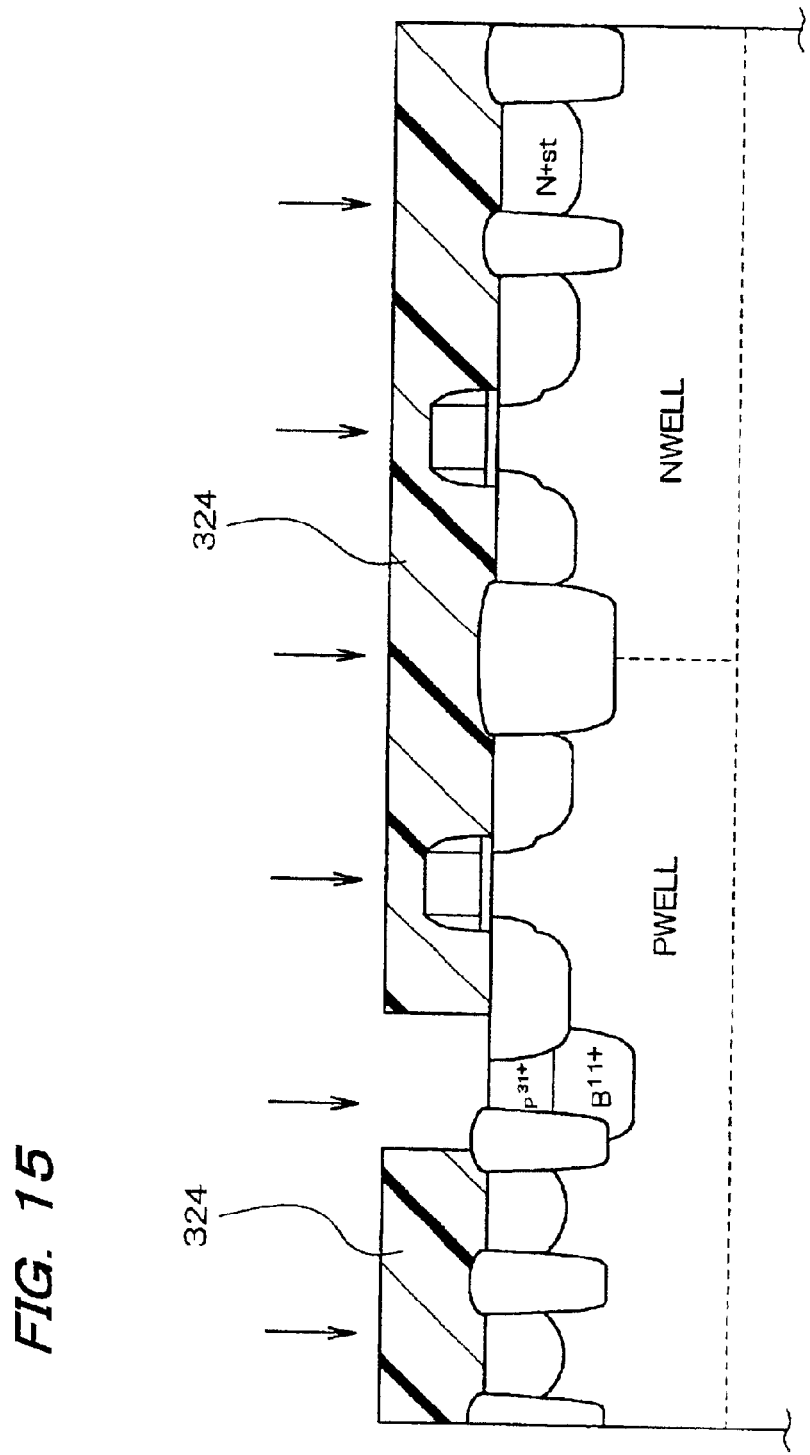
FIG. 15 is a cross-sectional view showing a twelfth fabrication step of the semiconductor device shown in FIG. 1.

After removing the resist 322, a resist 324 is patterned by a photolithography process, as shown in FIG. 15. P-type and N-type impurities are implanted using the resist 324 as a mask. Implantation of phosphorus (P) having a mass number of 31 and boron (B) having a mass number of 11 as N-type impurities and P-type impurities, respectively, allows the $P^{31+}$ diffusion region and the $B^{11+}$ diffusion region shown in FIG. 1 to be formed. In the present embodiment, the resist 324 can be used as a common mask for doping with two types of ions.

Figure 16:
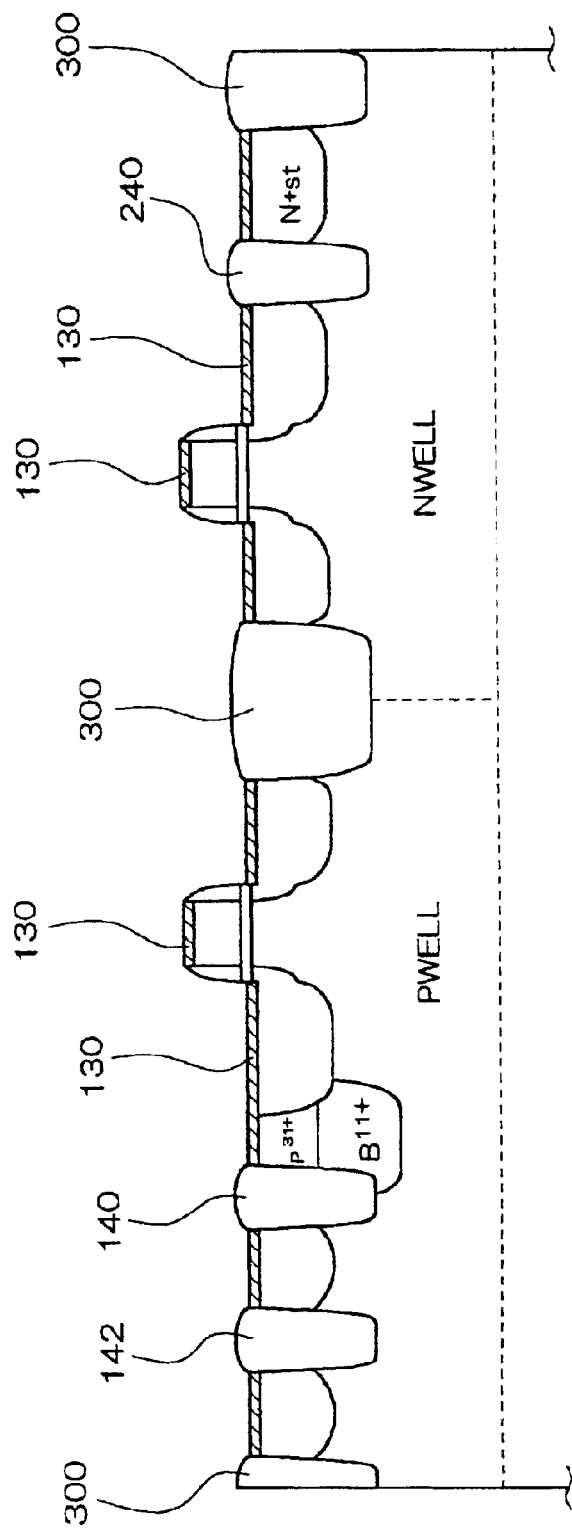
FIG. 16 is a cross-sectional view showing a thirteenth fabrication step of the semiconductor device shown in FIG. 1.

After removing the resist 324, a high-melting-point metal such as titanium (Ti) is formed on silicon exposed by the surface of the silicon substrate 100 and the gates 118 and 218 and provided with annealing, whereby the titanium silicide layer 130 is formed, as shown in FIG. 16.

Figure 17:
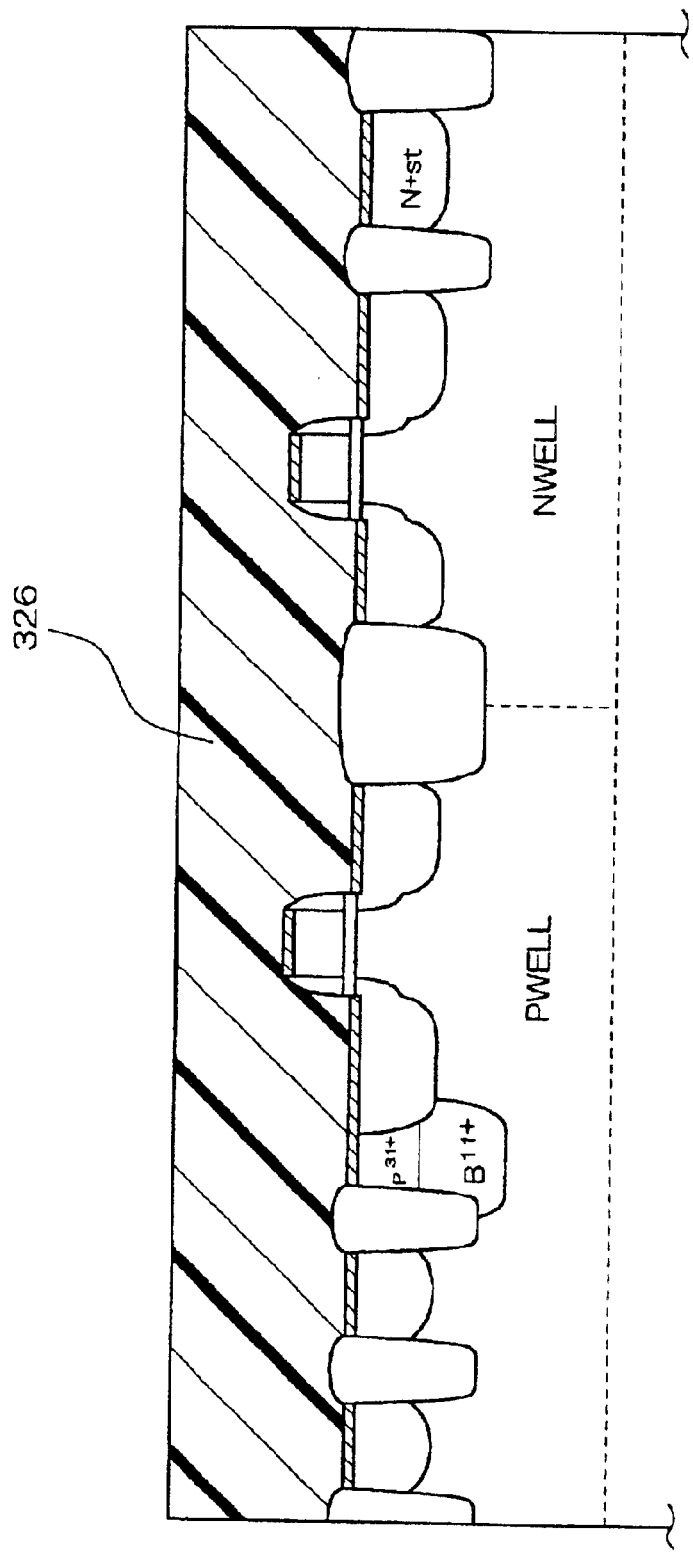
FIG. 17 is a cross-sectional view showing a fourteenth fabrication step of the semiconductor device shown in FIG. 1.
Figure 18:
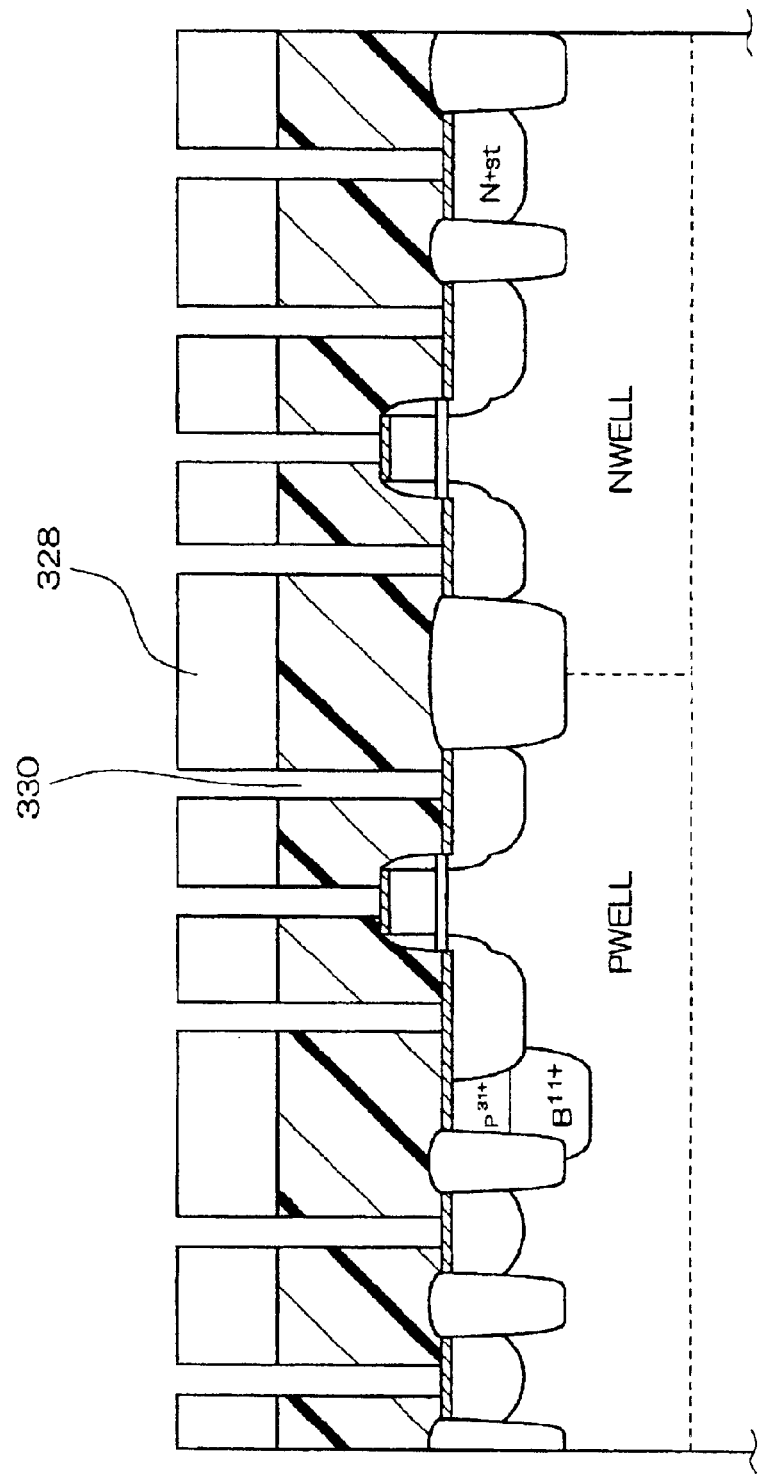
FIG. 18 is a cross-sectional view showing a fifteenth fabrication step of the semiconductor device shown in FIG. 1.

An insulating layer 326 is formed over the entire surface of the silicon substrate 100, as shown in FIG. 17. After forming a resist 328 on the insulating layer 326, the resist 328 is patterned by a photolithography process. The insulating layer 326 is etched using the resist 328 as a mask, thereby forming contact holes 330 as shown in FIG. 18.

Figure 19:
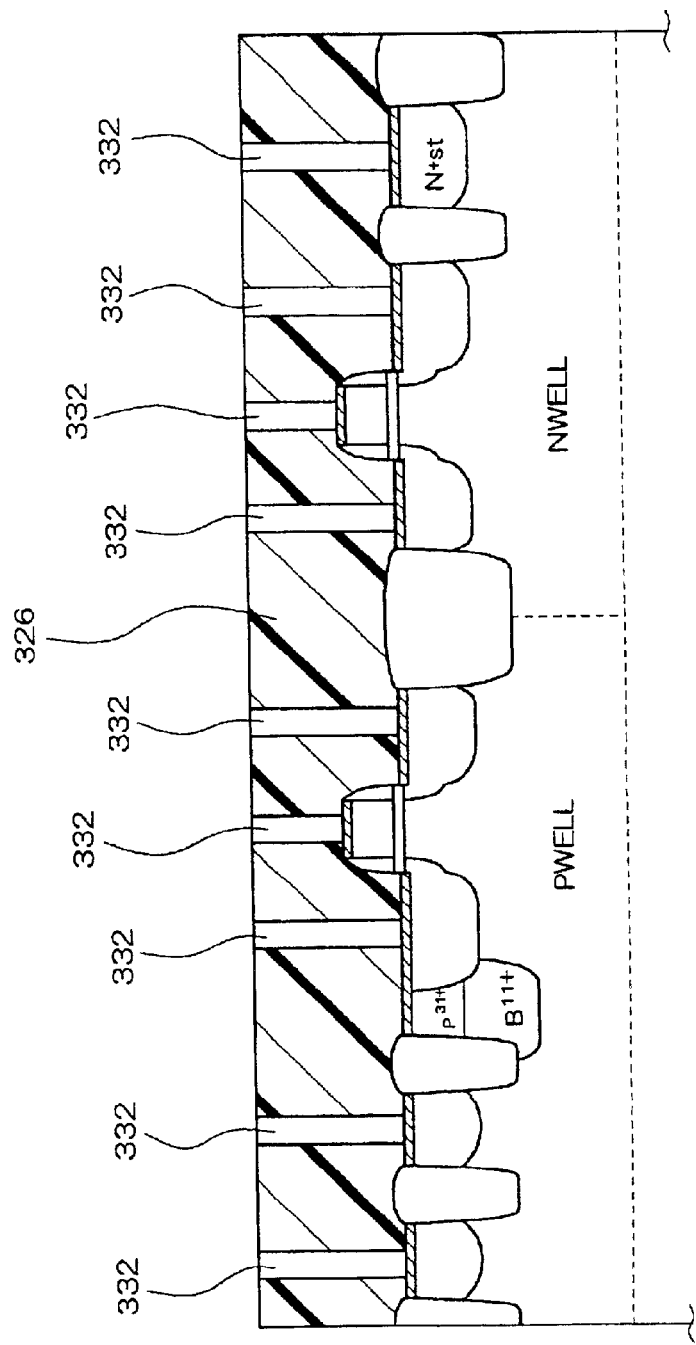
FIG. 19 is a cross-sectional view showing a sixteenth fabrication step of the semiconductor device shown in FIG. 1.

After removing the resist 328, the contact holes 330 are filled with tungsten, for example, thereby forming contacts 332 as shown in FIG. 19.

Figure 20:
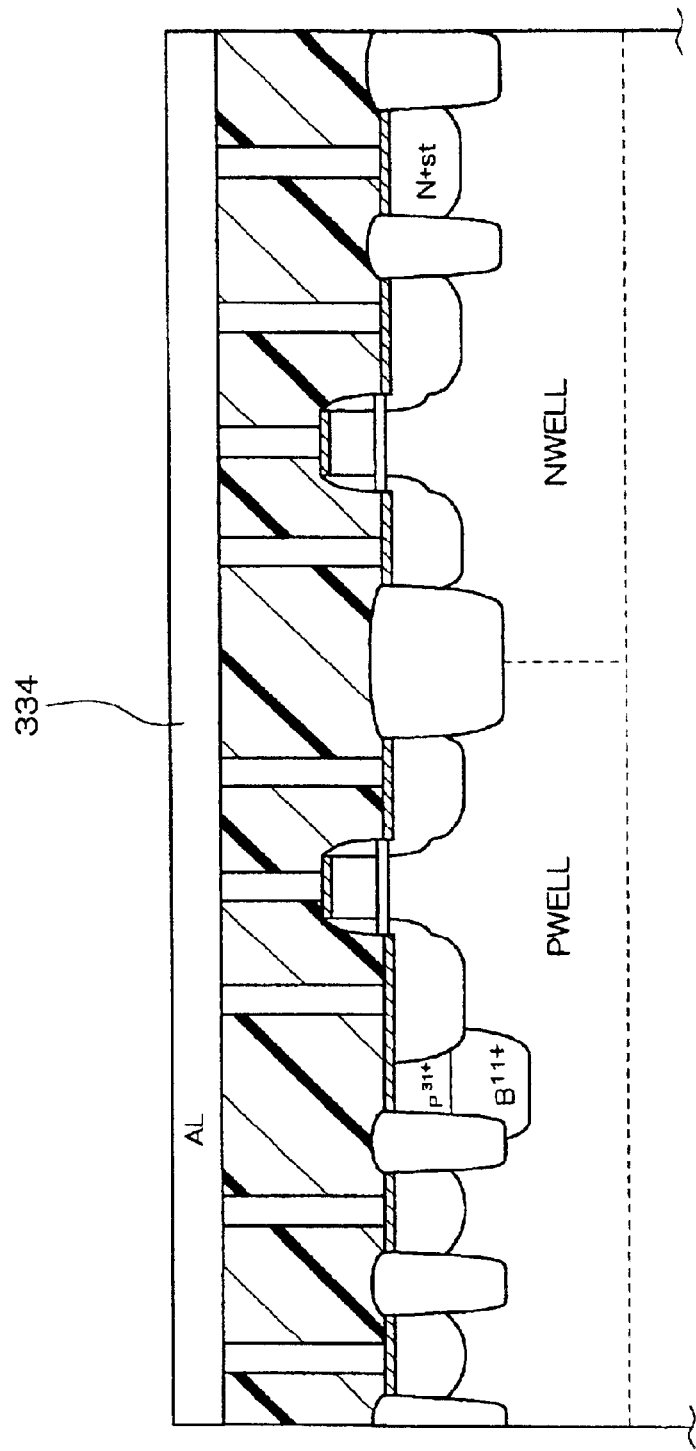
FIG. 20 is a cross-sectional view showing a seventeenth fabrication step of the semiconductor device shown in FIG. 1.
Figure 21:
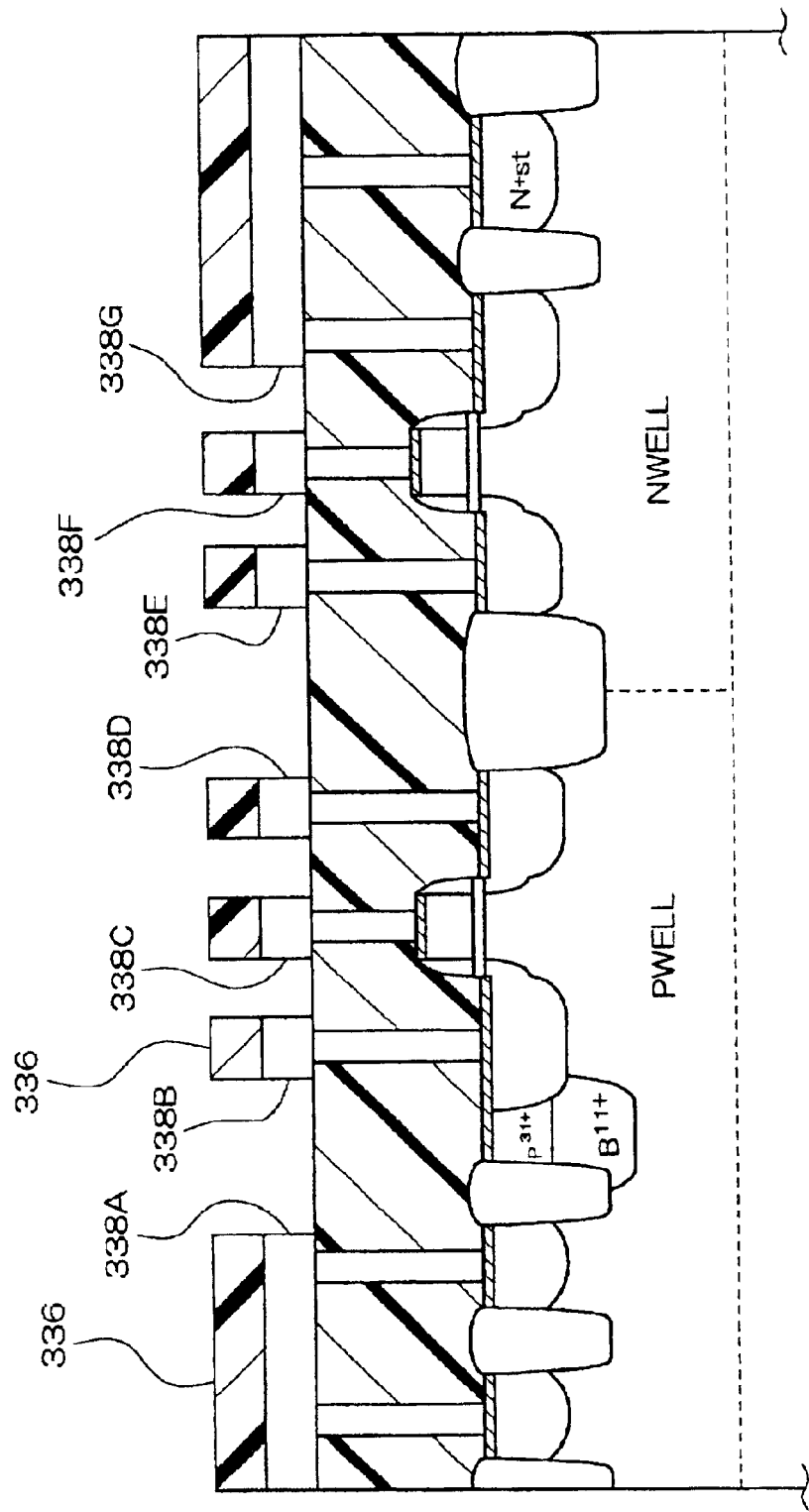
FIG. 21 is a cross-sectional view showing an eighteenth fabrication step of the semiconductor device shown in FIG. 1.

A metal layer 334 such as an aluminum layer is formed on the insulating layer 326 and the contacts 332, as shown in FIG. 20. After forming a resist 336 on the metal layer 334, the resist 336 is patterned by a photolithography process. The metal layer 334 is etched using the resist 336 as a mask, thereby forming metal interconnect layers 338A to 338G, as shown in FIG. 21.

Figure 22:
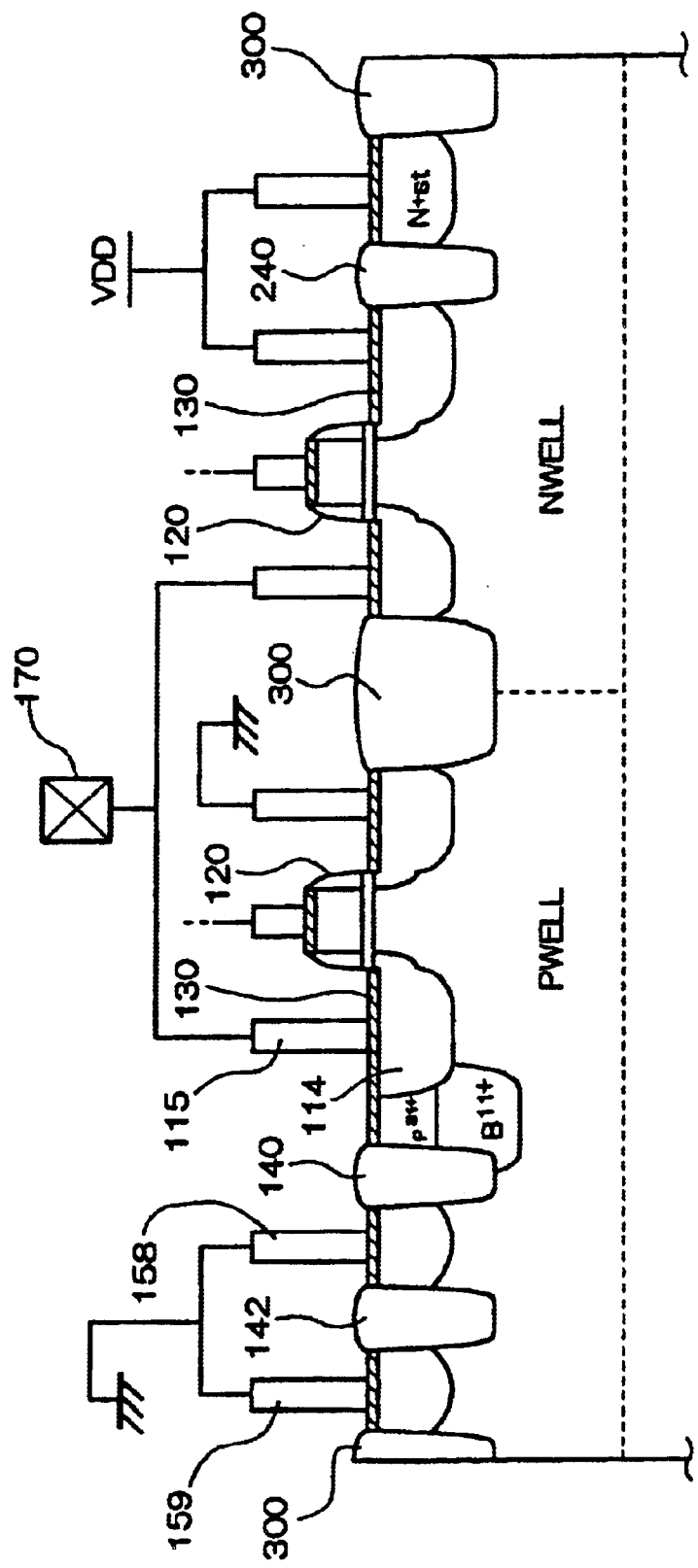
FIG. 22 is a cross-sectional view of a semiconductor device formed by the fabrication steps shown in FIGS. 4 to 21.

The resist 336 is then removed and the metal interconnect layers 338A to 338G are connected to VDD, GND, and the like, thereby completing the semiconductor device as shown in FIG. 22.

Throughput is improved since the ion doping step shown in FIG. 15 can be continuously performed with the ion doping steps shown in FIGS. 13 and 14. However, the present embodiment is not limited thereto. The step shown in FIG. 15 is performed after the source and drain are formed but before the silicide layer is formed. It is unnecessary to continuously form the $p^{31}$ diffusion region and the $B^{11}$ diffusion region. The formation steps may be separately performed if the mask is not shared. In the case where the mask is not shared, the $B^{11}$ diffusion region shown in FIG. 1 may be formed in a narrower region or a broader region on the side of the drain 114. In addition, the diffusion regions may be formed by doping with other impurity ions in place of the $P^{31}$ diffusion region and the $B^{11}$ diffusion region.

Second Embodiment

Figure 23:
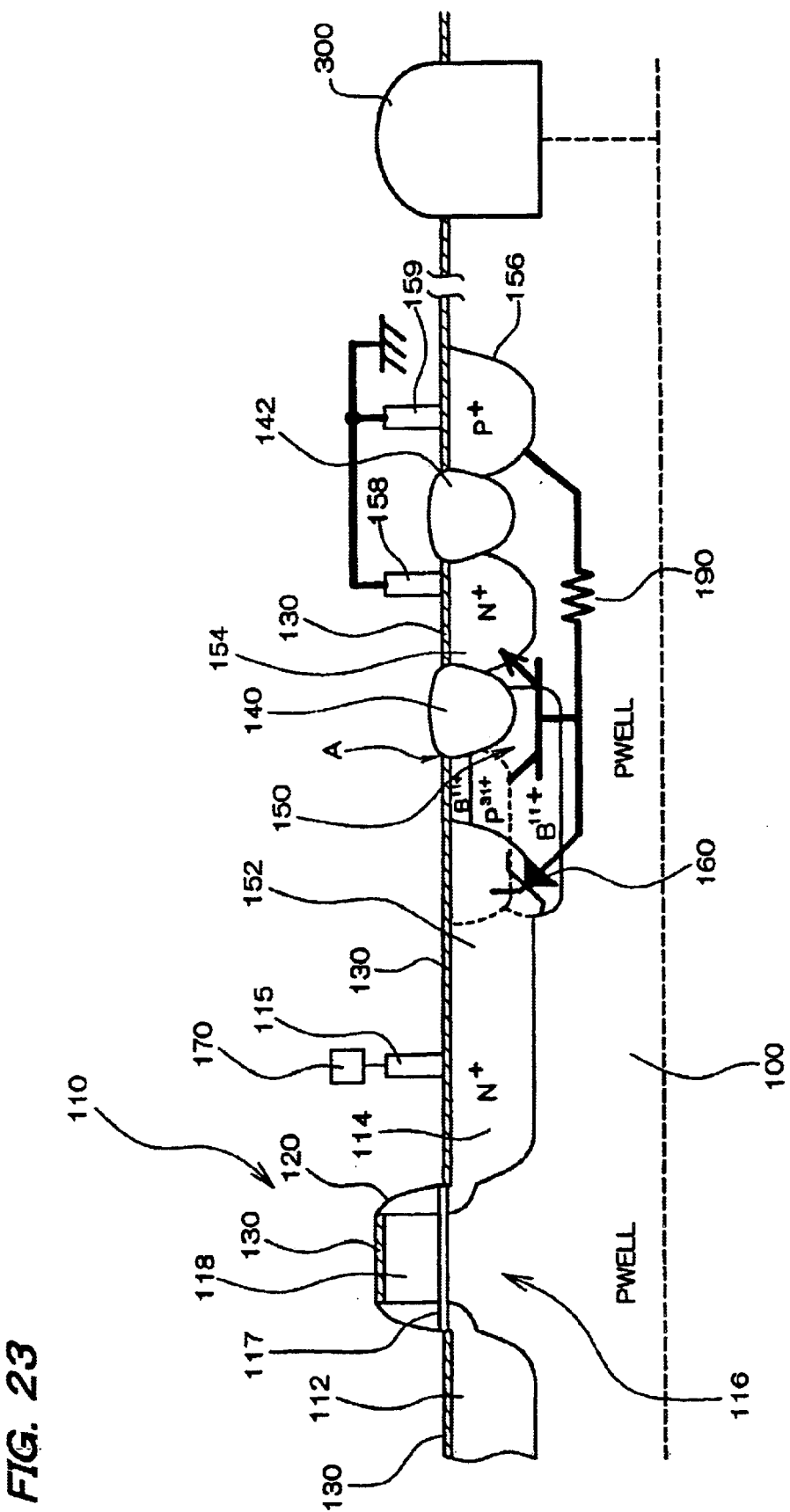
FIG. 23 is a cross-sectional view showing the structure of an N-type MOS transistor and an electrostatic protection circuit for a semiconductor device according to a second embodiment of the present invention.

FIG. 23 is a cross-sectional view showing a semiconductor device according to a second embodiment. In FIG. 23, the same components as those shown in FIG. 1 are indicated by the same symbols.

The only difference between an electrostatic protection circuit for the MOS transistor 110 shown in FIG. 23 and the electrostatic protection circuit shown in FIG. 1 is that a first $B^{11}$ diffusion region (fifth diffusion region) and a second $B^{11}$ diffusion region (third diffusion region) are formed on the upper side and the lower side of the $P^{31}$ diffusion region (fourth diffusion region).

In the electrostatic protection circuit shown in FIG. 23, the first $B^{11}$ diffusion region, the $P^{31}$ diffusion region, and the second $B^{11}$ diffusion region make up a PNP bipolar transistor. Therefore, since the current does not flow through the PNP bipolar transistor even if the silicide layer 130 is formed so as to be in contact with the first $B^{11}$ diffusion region, it is possible to reliably prevent the current from flowing through the silicide layer 130.

Therefore, the degree of necessity for performing a protection step for partly removing the silicide layer 130 between the contact 115 and the second isolation region 142 is further decreased in comparison with the structure shown in FIG. 1.

Third Embodiment

Figure 24:
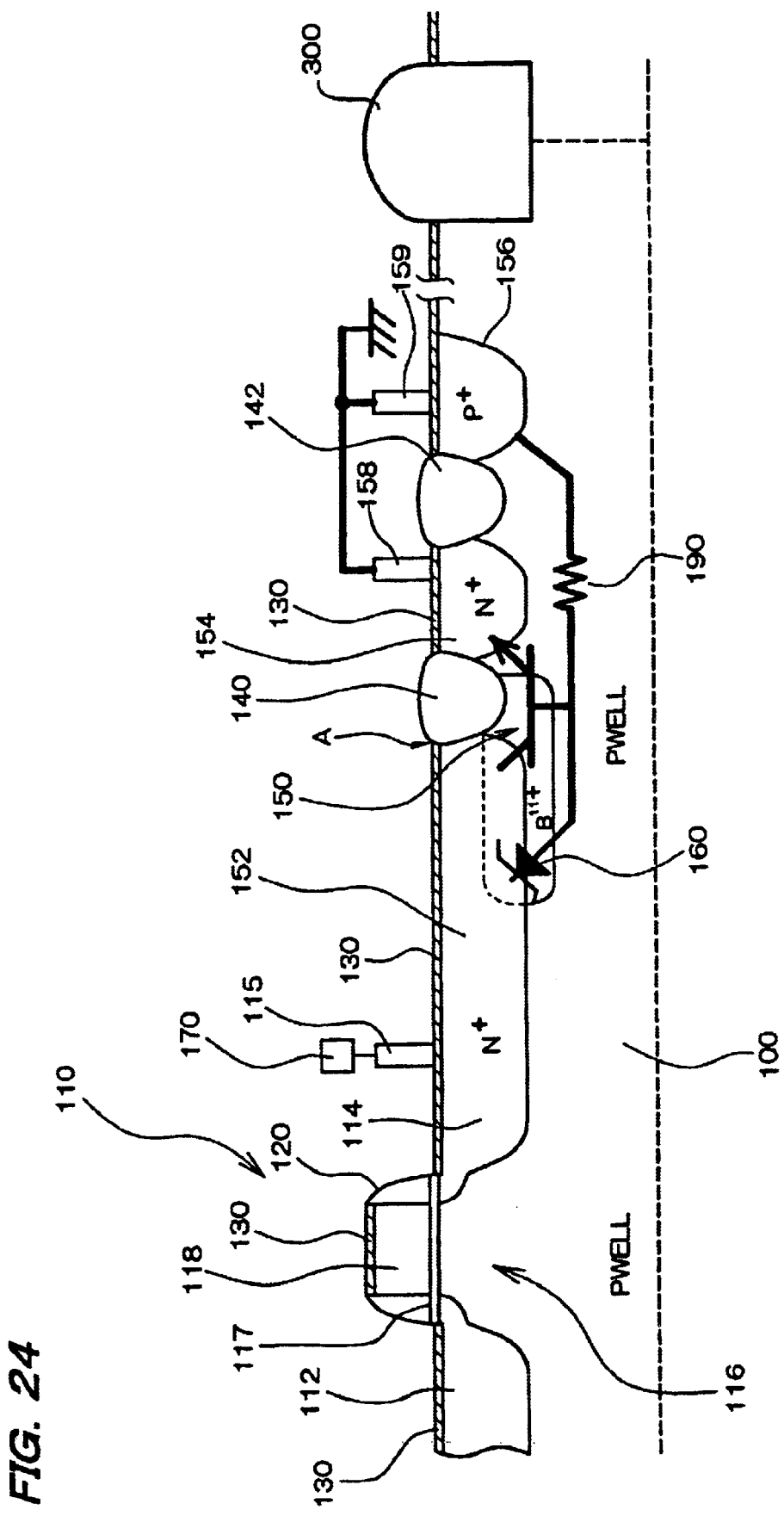
FIG. 24 is a cross-sectional view showing the structure of an N-type MOS transistor and an electrostatic protection circuit for a semiconductor device according to a third embodiment of the present invention.

FIG. 24 is a cross-sectional view showing a semiconductor device according to a third embodiment. In FIG. 24, the same components as those shown in FIG. 1 are indicated by the same symbols.

The $P^{31}$ diffusion region shown in FIG. 1 is not formed in the electrostatic protection circuit for the MOS transistor 110 shown in FIG. 24. Only the $B^{11}$ diffusion region (third diffusion region) which makes up the Zener diode 160 with the drain 114 is formed. In FIG. 24, a P stopper diffusion region may be formed under the second isolation region 140.

In this case, the Zener diode 160 allows the current to flow before breakdown occurs in the MOS transistor 110 in the same manner as in FIG. 1. This causes the NPN lateral bipolar transistor 150 to be turned ON, thereby securing the discharge path. In the case where a comparatively high voltage is applied due to static electricity, the junction breakdown start voltage between the collector 152 and the base 156 of the NPN lateral bipolar transistor 150 can be decreased by allowing breakdown to occur in the Zener diode 160.

Since the Zener diode 160 is formed by the PN junction between the drain 114 and the $B^{11}$ ion doped diffusion region present at a comparatively deeper position from the surface of the silicon substrate 100, a charge injected into the drain 114 scarcely flows through the surface of the low-resistivity silicide layer 130.

According to the structure shown in FIG. 24, a Schottky diode is not formed by the silicide layer 130 and the $P^{31}$ diffusion region as in the structure shown in FIG. 1. In the case of avoiding the risk of allowing the current to be concentrated at point A shown in FIG. 24, a protection step for partly removing the silicide layer 130 between the contact 115 and the second isolation region 142 may be performed.

Characteristic Evaluation

Evaluation of the electrostatic protection circuit for the semiconductor device fabricated according to the first to third embodiments of the present invention is described below with reference to FIGS. 25 to 27.

Figure 25A:
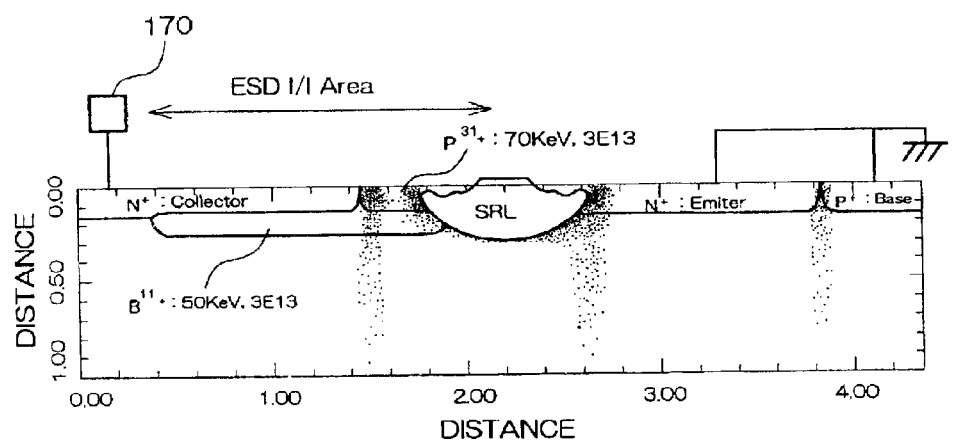
FIG. 25A is a cross-sectional view of the semiconductor device fabricated according to the first embodiment of the present invention.
Figure 26A:
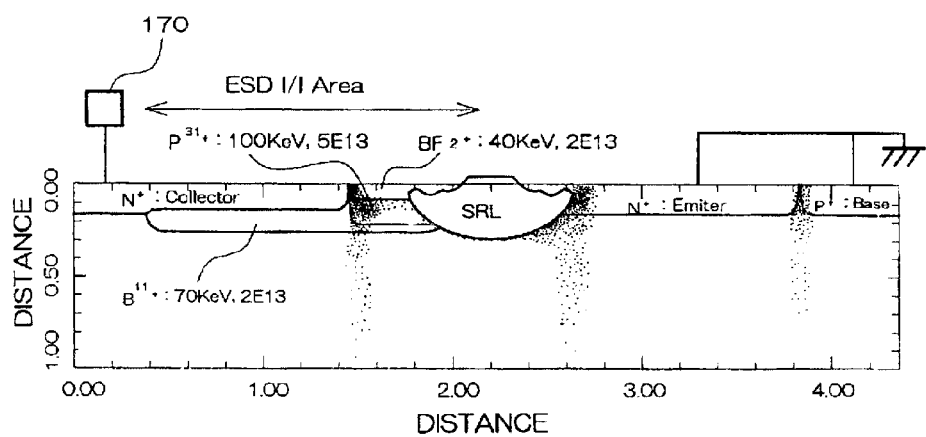
FIG. 26A is a cross-sectional view of the semiconductor device fabricated according to the second embodiment of the present invention.
Figure 27A:
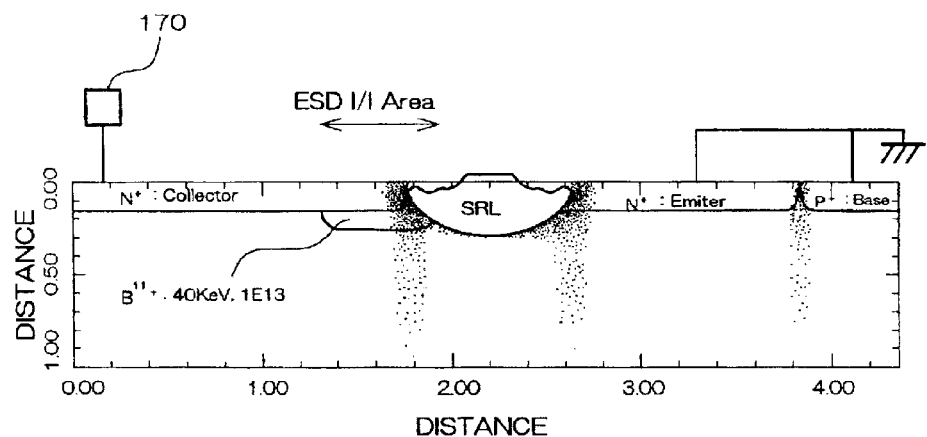
FIG. 27A is a cross-sectional view of the semiconductor device fabricated according to the third embodiment of the present invention.

FIGS. 25A, 26A, and 27A are cross-sectional views respectively showing the semiconductor devices fabricated according to the first to third embodiments, in which the current density inside the cross section is illustrated. In these figures, the vertical axis (depth) distance from the surface of the substrate and the horizontal axis distance from the pad 170 are illustrated.

The $P^{31}$ diffusion region shown in FIG. 25A is formed by implantation of phosphorus (P) having a mass number of 31 at 70 KeV. The $B^{11}$ diffusion region is formed by implantation of boron (B) having a mass number of 11 at 50 KeV.

A $BF_2$ diffusion region shown in FIG. 26A is formed in place of the first $B^{11}$ diffusion region shown in FIG. 23, which is formed by implantation of $BF_2$ at 40 KeV. The $P^{31}$ diffusion region is formed by implantation of phosphorus (P) having a mass number of 31 at 100 KeV. The $B^{11}$ diffusion region is formed by implantation of boron (B) having a mass number of 11 at 70 KeV.

The $B^{11}$ diffusion region shown in FIG. 27A is formed by implantation of boron (B) having a mass number of 11 at 40 KeV.

Figure 25B:
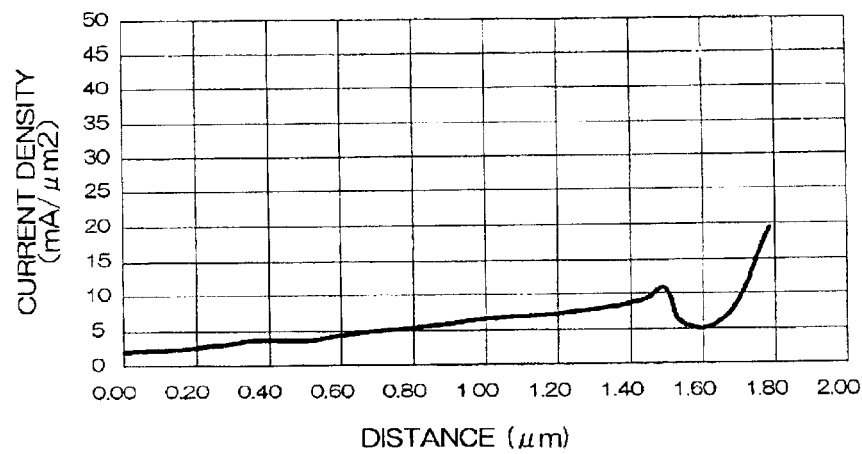
FIG. 25B is a characteristic diagram showing the positional dependency of the current density in this device at a depth of 0.05 µm.
Figure 26B:
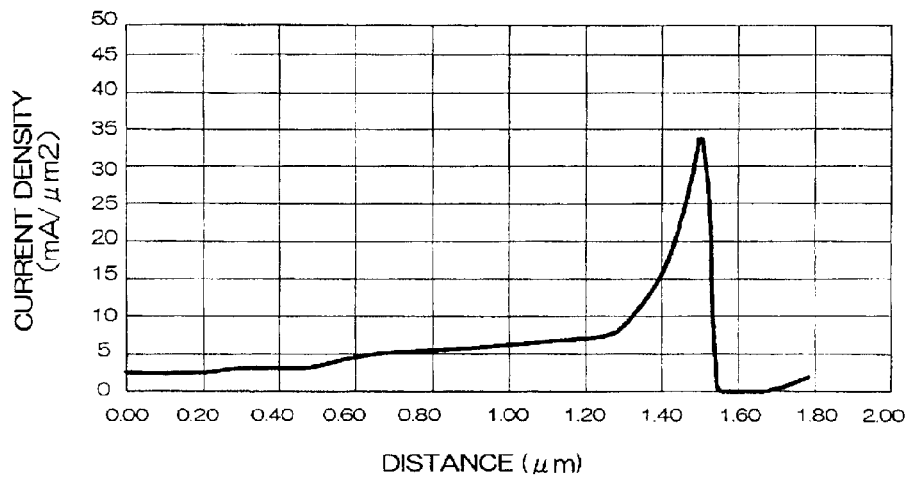
FIG. 26B is a characteristic diagram showing the positional dependency of the current density in this device at a depth of 0.05 µm.
Figure 27B:
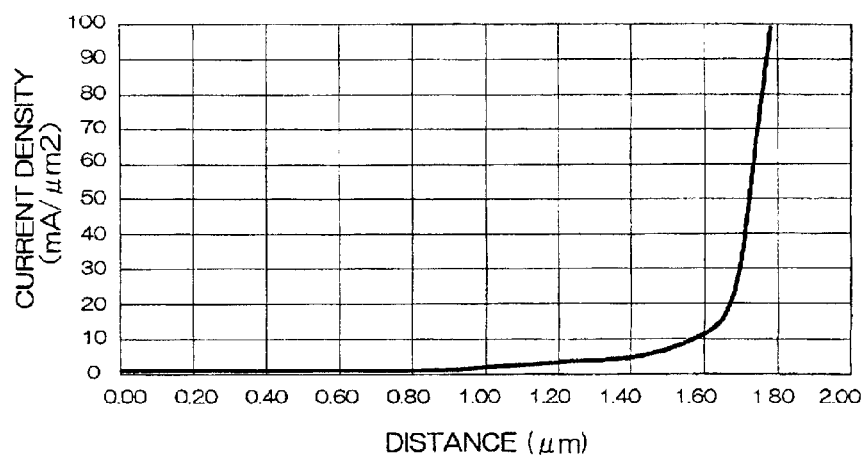
FIG. 27B is a characteristic diagram showing the positional dependency of the current density in this device at a depth of 0.05 µm.

The characteristic diagrams shown in FIGS. 25B, 26B, and 27B show the current density (ma/$\mu m^2$) at a depth of 0.05 $\mu m$ from the surface of each semiconductor device shown in FIGS. 25A, 26A, and 27A.

As is clear from the comparison between FIG. 25B and FIG. 27B, the peak value of the current density at a horizontal axis distance of 1.8 μm from the pad 170 in the first embodiment is about one fifth the peak value in the third embodiment.

Since the PNP bipolar transistor is formed at a horizontal axis distance of 1.8 μm from the pad 170 in FIG. 26B, the current density is lower than that in FIG. 25B. In FIG. 26B, the current density peaks at a horizontal axis distance of 1.5 μm from the pad 170.

The peak value of the current density shown in FIG. 27B is sufficiently low in comparison with a prior art in which the second isolation region 142 and the $B^{11}$ diffusion region are not formed. However, a protection step may be performed as described above in order to further decrease the current concentration at this point.

Fourth Embodiment

Figure 28:
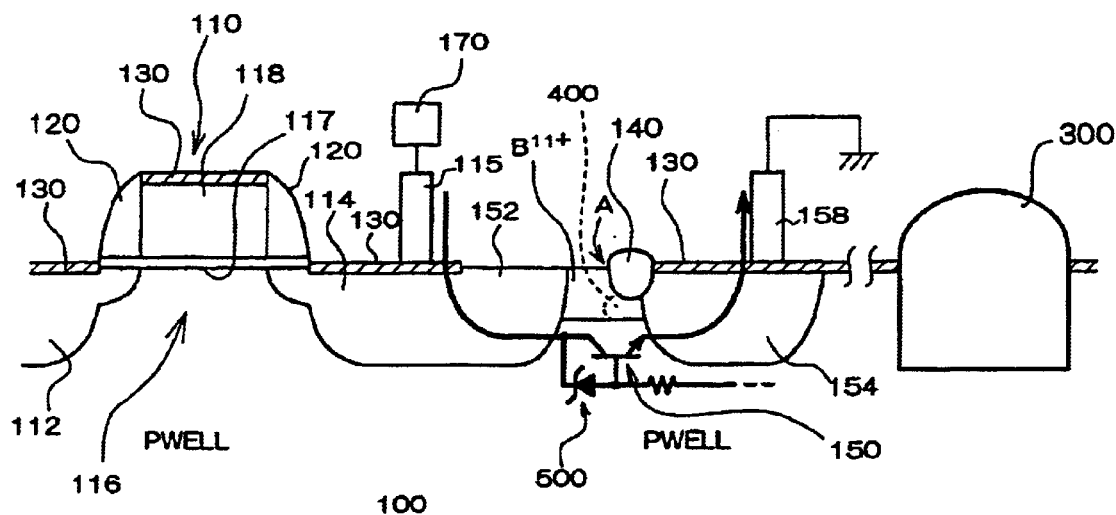
FIG. 28 is a cross-sectional view showing the structure of an N-type MOS transistor and an electrostatic protection circuit for a semiconductor device according to a fourth embodiment of the present invention.

FIG. 28 is a cross-sectional view showing a semiconductor device according to a fourth embodiment of the present invention. In FIG. 28, the same components as those shown in FIG. 1 are indicated by the same symbols.

The semiconductor device shown in FIG. 28 is provided with a protection step. Specifically, the silicide layer 130 is partly removed between the contact 115 and the second isolation region 140. In the semiconductor device shown in FIG. 28, the $B^{11}$ diffusion region is formed between the collector 152 and the second isolation region 140 at the surface of the silicon substrate 100. The silicide layer 130 is not formed on the surface of the $B^{11}$ diffusion region and the collector 152.

In this fourth embodiment, a Zener diode 500 is formed by the PN junction between the $B^{11}$ diffusion region (third diffusion region) and the drain 114 as the electrostatic protection circuit for the MOS transistor 110. The collector 152, the emitter 154, the base 156 (omitted in FIG. 28), and the P-type well make up the NPN lateral bipolar transistor 150 in the same manner as in FIG. 1. A P stopper diffusion region 400 is formed under the second isolation region 140 in the same manner as in FIG. 24.

In this case, the Zener diode 500 allows the current to flow before breakdown occurs in the N-type MOS transistor 110 in the same manner as in FIG. 1. This causes the NPN lateral bipolar transistor 150 to be turned ON, thereby securing the discharge path. In the case where a comparatively high voltage is applied due to static electricity, the junction breakdown start voltage between the collector 152 and the base 156 of the NPN lateral bipolar transistor 150 can be decreased by allowing breakdown to occur in the zener diode 500.

The Zener diode 500 is formed by the PN junction between the B11 ion doped diffusion region near the surface of the silicon substrate 100 and the drain 114 (collector 152), differing from the first to third embodiments.

Fifth Embodiment

Figure 29:
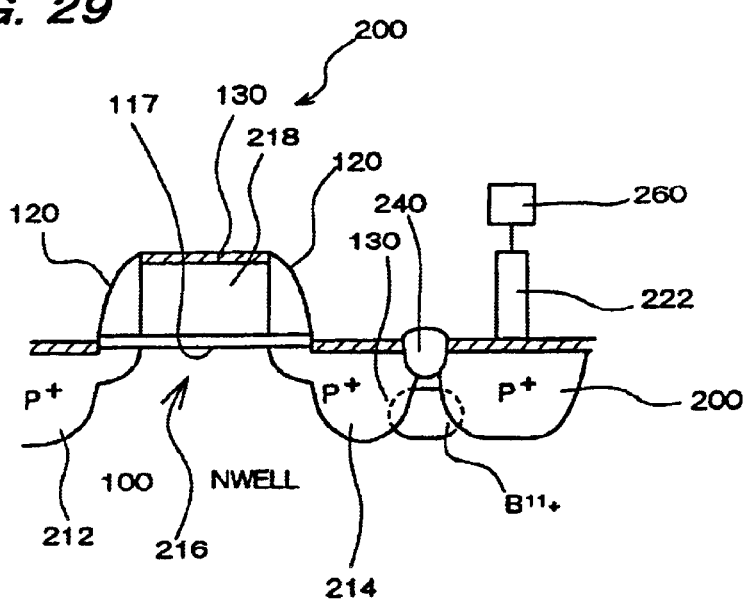
FIG. 29 is a cross-sectional view showing the structure of an P-type MOS transistor and an electrostatic protection circuit for a semiconductor device according to a fifth embodiment of the present invention.

FIG. 29 is a cross-sectional view showing a semiconductor device according to a fifth embodiment in which the present invention is applied to an electrostatic protection circuit for a P-type MOS transistor.

In FIG. 29, the P-type MOS transistor 200 formed on the same silicon substrate 100 as the substrate shown in FIG. 1 includes a $P^+$ source 212, a $P^+$ drain 214, a channel 216 of an N-type well present therebetween, and a gate 218 which faces the channel 216 through the gate oxide film 117. The side-wall insulating film 120 is formed on the side wall of the gate 218. A silicide layer 130 is formed on the source 212, drain 214, and gate 218, whereby the P-type MOS transistor 200 is formed as a salicide transistor.

In FIG. 29, in addition to a first isolation region (not shown) for isolating each of the transistors, a second isolation region 240 formed by a LOCOS process in the same manner as the first isolation region is formed. A $P^+$ diffusion region 220 isolated from the source 212 through the second isolation region 240 is formed. In FIG. 4, a contact 222 connected to the $P^+$ diffusion region 220 is connected to a pad 260.

A $B^{11+}$ diffusion region which functions as a resistance is formed below the second isolation region 240.

Figure 30:
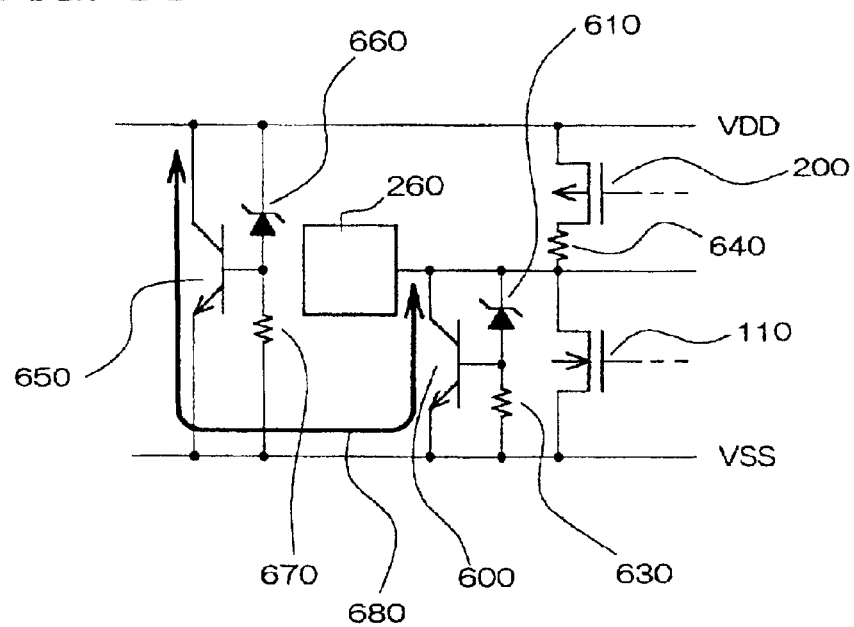
FIG. 30 is an equivalent circuit diagram of the P-type MOS transistor and the electrostatic protection circuit shown in FIG. 29.

FIG. 30 shows an equivalent circuit diagram showing the P-type MOS transistor 200 and the electrostatic protection circuit including the $B^{11+}$ diffusion region shown in FIG. 29.

An NPN lateral bipolar transistor 600, a Zener diode 610, and a resistance 630 shown in FIG. 30 have the same function as the NPN lateral bipolar transistor 150, the Zener diode 160, and the resistance 190 shown in FIGS. 1 and 2, respectively. In FIG. 30, the P-type MOS transistor 200 is connected to the pad 260 through a resistance 640 formed by the $B^{11+}$ diffusion region. Therefore, even if static electricity is applied to the pad 260, the P-type MOS transistor 200 does not become the discharge path because of the presence of the resistance 640, thereby preventing the occurrence of breakdown of the P-type MOS transistor 200.

In FIG. 30, an NPN lateral bipolar transistor 650, a Zener diode 660, and a resistance 670 which function as a protection circuit between VDD and VSS are formed.

Therefore, static electricity applied to the pad 260 is removed toward the VSS side through the NPN lateral bipolar transistor 600 by the trigger of the Zener diode 610, and then removed toward the VDD side through the NPN lateral bipolar transistor 650.

It is unnecessary to increase the resistivity of the resistance 640 shown in FIG. 30 to such an extent that the pull-up operation of the P-type MOS transistor 200 is affected. Moreover, an increase in the area for forming the resistance 640 hinders a higher degree of integration. Therefore, in the present embodiment, the resistance 640 is formed by forming the $B^{11+}$ diffusion region below the isolation region, as shown in FIG. 29. This $B^{11+}$ diffusion region can be formed by the same step as the $B^{11+}$ diffusion region (third diffusion region) shown in FIG. 1, thereby preventing an increase in the number of fabrication steps.

In FIG. 1, the drain 114 of the N-type MOS transistor 110 and the collector 152 of the NPN lateral bipolar transistor 150 are formed in the common diffusion region. However, there are no functional differences if the semiconductor device has a structure in which these components are separated as shown in FIG. 29.

Sixth Embodiment

Figure 31:
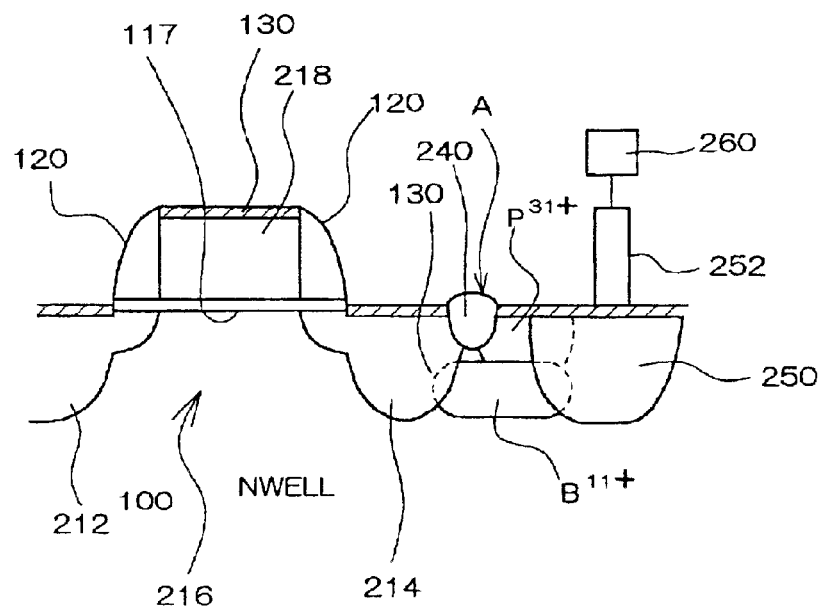
FIG. 31 is a cross-sectional view showing the structure of an P-type MOS transistor and an electrostatic protection circuit for a semiconductor device according to a sixth embodiment of the present invention.
Figure 32:
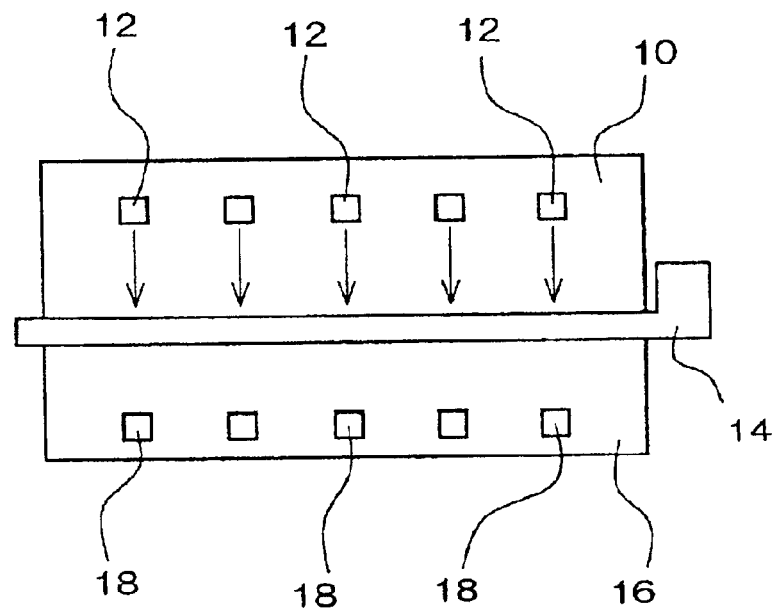
FIG. 32 is a view schematically showing the state of uniform discharge in a conventional case where a silicide layer is not formed on diffusion layers.
Figure 33:
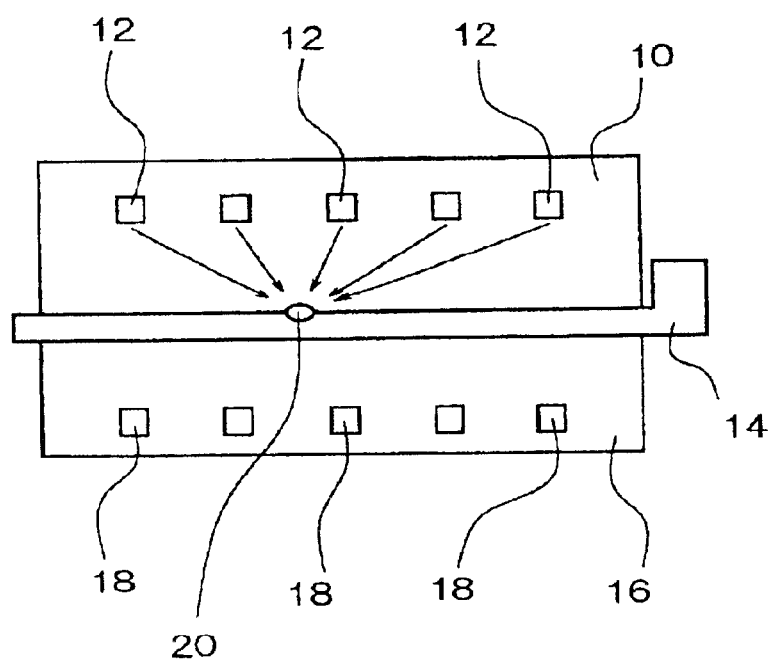
FIG. 33 is a view schematically showing the state of discharge in a conventional case where a silicide layer is formed on diffusion layers, in which current is concentrated on a hot spot.

FIG. 31 is a cross-sectional view showing a semiconductor device according to a sixth embodiment in which the present invention is applied to an electrostatic protection circuit for a P-type MOS transistor. In FIG. 31, the same components as those of the P-type MOS transistor shown in FIG. 29 are indicated by the same symbols.

The difference between the electrostatic protection circuit for the MOS transistor 200 shown in FIG. 31 and the electrostatic protection circuit shown in FIG. 29 is that a $P^{11}$ diffusion region is additionally formed between the silicide layer 130 and the $B^{11}$ diffusion region.

According to this structure, the function of the electrostatic protection circuit shown in FIG. 29 can be achieved. Moreover, a Schottky diode is formed by the silicide layer 130 and the $P^{31}$ diffusion region in the same manner as the electrostatic protection circuit for the N-type MOS transistor 110 shown in FIG. 1. Therefore, the amount of charge flowing through the surface of the silicide layer 130 is further decreased, thereby preventing the occurrence of current concentration at point A shown in FIG. 31.

For these reasons, it is unnecessary to perform a protection step for partly removing the silicide layer 130 between the contact 252 and the second isolation region 240.

The present invention is not limited to the above-described embodiments. Various modifications and variations are possible without departing from the spirit and the scope of the present invention.

Each of the above embodiments illustrates an example using a P-type semiconductor substrate. However, the above embodiments can be carried out in the same manner using an N-type semiconductor substrate. In this case, the N-type and P-type in FIGS. 1 to 31 are respectively replaced by a P-type and N-type. In addition, a PNP lateral bipolar transistor which protects a P-type MOS transistor and a Zener diode which functions as a trigger thereof are formed.

Use of a semiconductor substrate having a triple-well structure enables the formation of an NPN lateral bipolar transistor which functions as a protection circuit for an N-type MOS transistor and a PNP lateral bipolar transistor which functions as a protection circuit for a P-type MOS transistor on the same semiconductor substrate.

What is claimed is:

1. A semiconductor device comprising:

a semiconductor substrate having a P-type well;

an N-type MOS transistor which is formed on the semiconductor substrate to pull down a pad and includes a first N-type diffusion region connected to the pad;

a first isolation region which isolates the N-type MOS transistor from other adjacent MOS transistors on the semiconductor substrate;

a second isolation region formed between the N-type MOS transistor and the first isolation region;

a second N-type diffusion region which is formed in a region isolated by the second isolation region from the N-type MOS transistor and makes up a lateral bipolar transistor together with the P-type well in the semiconductor substrate and the first N-type diffusion region of the N-type MOS transistor;

a first P-type diffusion region which is formed at a deeper position than of the first N-type diffusion region adjacent to the second isolation region and makes up a Zener diode by the PN junction together with the first N-type diffusion region of the N-type MOS transistor;

a second P-type diffusion region which is isolated by a third isolation region from the second N-type diffusion region;

a silicide layer formed on a surface of the semiconductor substrate excluding the first to third isolation regions; and a ground terminal which is connected to the second N-type diffusion region and the second P-type diffusion region through the silicide layer.

2. The semiconductor device as defined in claim 1, wherein the impurity concentration of the first P-type diffusion region is set to a value enabling a breakdown start voltage of the Zener diode to be lower than a breakdown start voltage of the N-type MOS transistor.

3. The semiconductor device as defined in claim 1, further comprising:

a third N-type diffusion region which is provided between the silicide layer and the first P-type diffusion region and makes up a Schottky diode together with the silicide layer.

4. The semiconductor device as defined in claim 1, further comprising:

a third P-type diffusion region and a third N-type diffusion region formed between the silicide layer and the first P-type diffusion region, wherein the first and third P-type diffusion regions and the third N-type diffusion region make up a PNP bipolar transistor.

5. A semiconductor device comprising:

a semiconductor substrate having a P-type well;

an N-type MOS transistor which is formed on the semiconductor substrate to pull down a pad and includes a first N-type diffusion region connected to the pad;

a first isolation region which isolates the N-type MOS transistor from other adjacent MOS transistors on the semiconductor substrate;

a second isolation region formed between the N-type MOS transistor and the first isolation region;

a second N-type diffusion region which is formed in a region isolated by the second isolation region from the N-type MOS transistor and makes up a lateral bipolar transistor together with the P-type well in the semiconductor substrate and the first N-type diffusion region of the N-type MOS transistor;

a first P-type diffusion region which is formed between the second isolation region and the first N-type diffusion region and near a surface of the semiconductor substrate and makes up a Zener diode by the PN junction together with the first N-type diffusion region of the N-type MOS transistor;

a second P-type diffusion region which is isolated by a third isolation region from the second N-type diffusion region;

a silicide layer formed on a surface of the semiconductor substrate excluding the first to third isolation regions and a region connecting the first N-type diffusion region and first P-type diffusion region; and a ground terminal which is connected to the second N-type diffusion region and the second P-type diffusion region through the silicide layer.

6. The semiconductor device as defined in claim 5, wherein the impurity concentration of the first P-type diffusion region is set to a value enabling a breakdown start voltage of the Zener diode to be lower than a breakdown start voltage of the N-type MOS transistor.

7. The semiconductor device as defined in claim 1, further comprising:

a P-type MOS transistor which is formed on the semiconductor substrate to pull up the pad and includes a third P-type diffusion region connected to the pad through a resistance;

a fourth P-type diffusion region isolated by a fourth isolation region from the third P-type diffusion region; and a third N-type diffusion region formed lower than the fourth isolation region and between the third and fourth P-type diffusion regions, wherein the pad is connected to the fourth P-type diffusion region and the third N-type diffusion region functions as the resistance.

8. The semiconductor device as defined in claim 7 further comprising:

a fourth N-type diffusion region provided in a region surrounded by the silicide layer, third N-type diffusion region, fourth isolation region and fourth P-type diffusion region and makes up a Schottky diode together with the silicide layer, wherein the silicide layer is formed on a surface of the fourth P-type diffusion region.

* * * * *